United States Patent [19]

Yamaguchi et al.

[11] Patent Number: 5,091,280

[45] Date of Patent: Feb. 25, 1992

[54] LIGHT- AND HEAT-SENSITIVE RECORDING MATERIAL

[75] Inventors: Jun Yamaguchi; Shintaro Washizu; Hirotaka Matsumoto; Ken Iwakura; Yuuichi Fukushige, all of Shizuoka, Japan

[73] Assignee: Fuji Photo Film Co., Ltd., Kanagawa, Japan

[21] Appl. No.: 567,040

[22] Filed: Aug. 13, 1990

[30] Foreign Application Priority Data

Aug. 11, 1989 [JP] Japan .................. 1-209318
Aug. 31, 1989 [JP] Japan .................. 1-224930
Nov. 16, 1989 [JP] Japan .................. 1-298144
Jan. 30, 1990 [JP] Japan .................. 2-19710

[51] Int. Cl.⁵ ............................ G03C 1/72
[52] U.S. Cl. .......................... 430/138; 430/203; 503/200; 503/216; 503/219; 503/225; 503/226
[58] Field of Search ............. 430/138, 203, 281, 282, 430/292, 913, 916, 920; 503/200, 216, 219, 225, 226; 428/402.2, 402.24

[56] References Cited

U.S. PATENT DOCUMENTS

| | | | |
|---|---|---|---|
| 3,954,475 | 5/1976 | Bonham et al. | 430/281 |
| 3,987,037 | 10/1976 | Bonham et al. | 430/281 |
| 4,189,323 | 2/1980 | Buhr | 430/281 |
| 4,399,209 | 8/1983 | Sanders et al. | 430/138 |
| 4,440,846 | 4/1984 | Sanders et al. | 430/138 |
| 4,505,793 | 3/1985 | Tamoto et al. | 430/920 |
| 4,576,891 | 3/1986 | Adair et al. | 430/138 |
| 4,587,194 | 5/1986 | Adair et al. | 430/138 |
| 4,619,998 | 10/1986 | Buhr | 430/281 |
| 4,696,888 | 9/1987 | Buhr | 430/270 |
| 4,722,921 | 2/1988 | Kiritani et al. | 503/207 |
| 4,770,971 | 9/1988 | Sakai | 430/138 |

FOREIGN PATENT DOCUMENTS

109838 5/1984 European Pat. Off.
164931 12/1985 European Pat. Off.
3193882 11/1988 Japan.

OTHER PUBLICATIONS

Database WPIL, No. 86-186162, Derwent Publications Ltd, London GB; & JP-A-61-118749 (Konishiroku Photo K.K.) 06/06/86.
Patent Abstracts of Japan, vol. 13, No. 448 (P-942) Oct. 9, 1989, & JP-A-01-172973 (Konika Corp.) Jul. 7, 1989.
Derwent Abstracts, "Recording Material . . . ," J60 119552-A, 6/85.
Derwent Abstracts, "High Speed in Age-Forming . . . ," J52 089915, 7/1977.
Derwent Abstracts, "Photopolymerizable Co-Initiator . . . ," GB 2083832-A, 3/1982.
Derwent Abstracts, "Image Forming Process . . . ," J61 123838A, 6/1986.
Research Disclosure, "Photographic Silver Halide . . . ," RD 308119, 12/1989.
Research Disclosure, "Photographic Silver Halide . . . ," RD 17643, 12/1978.

*Primary Examiner*—Hoa Van Le
*Attorney, Agent, or Firm*—Sughrue, Mion, Zinn, Macpeak & Seas

[57] ABSTRACT

A light- and heat-sensitive recording material comprising a support having thereon at least one light- and heat-sensitive layer comprising, (1) microcapsules containing an electron donative colorless dye, and (2) a light-hardenable composition containing (a) a polymerizable vinyl monomer, (b) a photopolymerization initiator, and (c) an electron acceptive developer and a light- and heat-sensitive recording material comprising a support having thereon at least one light- and heat-sensitive layer comprising, (1) microcapsules containing an electron donative colorless dye, and (2) a light-hardenable composition containing (d) an electron acceptive polymerizable vinyl monomer and (b) a photopolymerization initiator.

28 Claims, 3 Drawing Sheets

LIGHT- AND HEAT-SENSITIVE RECORDING MATERIAL

FIELD OF THE INVENTION

This invention relates to a light- and heat-sensitive recording material for photothermography capable of being used for copiers, facsimiles, printers, labels, color proofs, overhead projectors, secondary originals, etc. More particularly, the invention relates to a mono-sheet type recording material without need of supplies which are required in conventional techniques.

BACKGROUND OF THE INVENTION

A light- and heat-sensitive recording material which can be image-exposed and thereafter developed by uniformly heating to provide images is called photothermography (a light- and heat-sensitive image-forming process) and has the feature that images are obtained simply by dry processing.

JP-A No. 59-190886 discloses such a process using a recording material having light- and heat-sensitive layer comprising microcapsules containing diazo compounds and fine dispersion of couplers capable of forming dye by diazo reaction. In this process, for obtaining an image, the recording material is heated to transfer the dispersed coupler into the microcapsules after photolyzing diazo compounds by exposure, to react the coupler with diazo compounds. However, this process needs a large amount of light for photolyzing diazo compounds.

A light hardenable composition can be used for producing a recording material having higher light-sensitivity.

A process of forming visible images by heat development using a photopolymerizable composition and a heat-sensitive coloring material is known as disclosed in JP-A No. 52-89915 (the term "JP-A" as used herein means an "unexamined published Japanese patent application"). In the process, a material wherein the two components of a two-component type heat-sensitive coloring material (e.g., an electron acceptive compound and an electron donative colorless dye) are separately disposed within and outside of microcapsules containing a light hardenable composition is imagewise exposed and heated. As a result, the light-exposed portions are not colored since these portions are hardened and thus a heat-sensitive component does not move in the portions. However, the heat-sensitive component moves in the unexposed portions undergoing reaction and coloring, whereby images are formed.

However, in this process, even if the light hardenable composition inside the microcapsules is sufficiently hardened, it is difficult to sufficiently restrain coloring at the light hardened portions on heat development. Thus indistinct images with a large amount of background fog are obtained.

Also, another technique involves a recording material having thereon a layer comprising a photopolymerizable composition composed of a vinyl monomer having an acid group and a photopolymerization initiator, a peeling layer and a layer comprising an electron donative colorless dye as disclosed in JP-A No. 61-123838. The recording material is imagewise exposed and uniformly heated for reaction with the leuco dye with an unpolymerized monomer having an acid group diffused therefrom, whereby a positive visible image is formed.

Also, a negative image can be obtained using the similar process as described in JP-A No. 60-119552.

In this method, the recording material wherein a photopolymerizable composition comprising a monomer (or premonomer) capable of bleaching a dye and a photopolymerization initiator and a dye to be bleached by the monomer are isolatedly present is imagewise exposed and uniformly heated. As a result, the monomer diffusing in the unpolymerized portion bleaches the dye to obtain a negative visible image.

However, in each of above two processes, coloring densities or degree of bleaching a dye is liable to decrease, therefore, the contrast of the image obtained is still low.

As a result of various investigations, an image has been obtained by coloring the light-hardened portions using a process comprising simply image exposure/heat development steps.

Also, for obtaining either positive image or negative one, while such light- and heat-sensitive recording materials may be used as a transfer type recording material using two sheets, it is preferred that at least two light- and heat-sensitive layers, each having a different light-sensitive wavelength and coloring hue, are present in a mono-sheet type multicolor recording material not requiring an extra sheet.

However, in the case of the mono-sheet type multicolor recording material, it is not easy to separate the light-sensitive wavelength regions of the light- and heat-sensitive layers from each other. That is, when known photopolymerization initiators or a known photopolymerization initiator/spectral sensitizer combination are used for the light- and heat-sensitive layers in the conventional manner, the light-sensitive wavelength regions of these layers overlap. As a result, it is difficult to photopolymerize each layer independently.

In this respect, addition of an ultraviolet absorbent to a light-sensitive composition is disclosed in U.S. Pat. No. 4,576,891. However, this point may be improved to some extent by this method but the overlap of the light-sensitive wavelength regions of the light- and heat-sensitive layers is still large.

This is because the unnecessary skirt at the short wavelength side of the light-sensitive region of each light-sensitive layer can be effectively cut but the skirt at the long wavelength side of each light-sensitive layer overlaps the light-sensitive wavelength regions of the layers.

SUMMARY OF THE INVENTION

As the result of intense investigations on the means of reducing overlap of wavelength regions, it has now been discovered that the skirt at the long wavelength region is uniquely and sharply cut by using a photopolymerizable initiator system having a specific composition.

That is, the overlapped region is eliminated by forming an interlayer containing an ultraviolet absorbent between a light- and heat-sensitive layer and another light- and heat-sensitive layer for controlling the light reaching the lower layer and/or using the specific photopolymerization initiator.

Also, by using the method of JP-A No. 61-123838, clear images with little background fog can be surely obtained. In this method, to obtain practical light sensitivity, it is preferred that the monomer having an acid group is in a liquid state and also is uniformly mixed with the photopolymerization intiator. However, since in this method, the recording layer contains a liquid monomer, there are problems on superposing an original on the recording layer at light-exposure, the liquid monomer having an acid group is transferred to the original side to stain the original and in an extreme case the monomer causes the recording material to adhere to the original, and the monomer stains the heating means, such as the heating rollers, etc., during heat development. Thus, the aforesaid method is unsuitable for practical use.

A first object of this invention is, therefore, to provide a multicolor light- and heat-sensitive recording material capable of converting (developing) a polymer image obtained by light hardening into a visible image by heat treatment.

A second object of this invention is to provide a light- and heat-sensitive recording material capable of providing a multicolor negative image by simply an image exposure and heat processing.

A third object of this invention is to provide a mono-sheet type multicolor light- and heat-sensitive recording material using no supplies.

A fourth object of this invention is to provide a multicolor light- and heat-sensitive recording material with less overlap in light-sensitive wavelength region of the light- and heat-sensitive layers and capable of recording specific color images independently.

A fifth object of this invention is to provide a multicolor light- and heat-sensitive recording material so constructed that it does not stain the original at image exposure and does not stick to an original.

The aforesaid objects are attained by the present invention, wherein coloring components or discoloring components are transferred by heating, corresponding to the latent image formed by exposure, to form a coloring image, and some embodiments thereof as set forth hereinbelow.

That is, the invention provides (A) a light- and heat-sensitive recording material comprising a support having formed thereon a light- and heat-sensitive layer containing (1) microcapsules containing an electron donative colorless dye and (2) a light hardenable composition comprising a polymerizable compound having at least one ethylenically unsaturated bond in the molecule (hereinafter referred to as "polymerizable vinyl monomer"), a photopolymerization initiator, and an electron acceptive developer, which can be used for obtaining a negative image of (B) a light- and heat-sensitive recording material comprising a support having thereon at least one light- and heat-sensitive layer containing (1) microcapsules containing an electron donative colorless dye, and (2) a light-hardenable composition containing an electron acceptive polymerizable vinyl monomer and a photopolymerization initiator, which can be used for obtaining a positive image, further includes the following embodiments.

The light- and heat-sensitive recording material (A) or (B) of this invention in one embodiment has at least two light- and heat-sensitive layers with an interlayer containing an ultraviolet absorbent between the two light- and heat-sensitive layers.

More specifically, the above objects are achieved by the following three specific embodiments of recording materials of this invention.

In one specific embodiment of this invention, this invention provides the light- and heat-sensitive recording material of (A) or (B), wherein the recording material has at least two light- and heat-sensitive layers and the photopolymerization initiator present in at least one of the light- and heat-sensitive layers is a compound represented by formula (I) or (II);

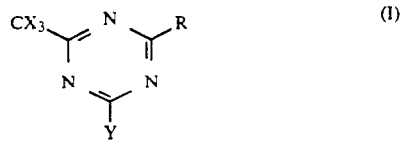

wherein X represents a halogen atom; Y represents $-CX_3$, $-NH_2$, $-NHR'$, $-N(R')_2$. or $-OR'$ (wherein R' represents an alkyl group, a substituted alkyl group, an aryl group, or a substituted aryl group) and R represents $-CX_3$, an alkyl group, a substituted alkyl group, an aryl group, a substituted aryl group, or a substituted alkenyl group;

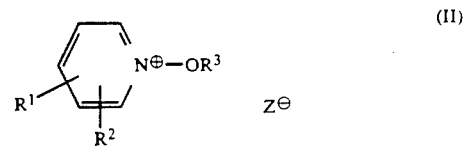

wherein $R^1$ represents an alkyl group, a substituted alkyl group, an aryl group, a substituted aryl group, a substituted alkenyl group, $R^4CO-$, or $R^4OCO-$ (wherein $R^4$ represents an alkyl group, a substituted alkyl group, an aryl group or a substituted aryl group); $R^2$ represents a hydrogen atom, an alkyl group, a substituted alkyl group, an aryl group, or an unsubstituted aryl group; and $R^1$ and $R^2$ may form together an aromatic ring structure; $R^3$ represents an alkyl group or a substituted alkyl group; and Z represents a counter anion.

In another specific embodiment of this invention, this invention provides the light- and heat-sensitive recording material (A) or (B), wherein the recording material has at least two light- and heat-sensitive layers and the photopolymerization initiator present in at least one of the light- and heat-sensitive layers is a compound represented by formula (I) or (II), each layer other than the uppermost layer contains an ultraviolet absorbent and the photopolymerization intiator present in each layer other than the lowermost layer is a compound represented by formula (I) or (II) described above.

In a further specific embodiment, this invention provides the light- and heat-sensitive recording material (A) or (B), wherein the recording material has at least two light- and heat-sensitive layers and the photopolymerization initiator present in at least one of the light- and heat-sensitive layers is a compound represented by formula (I) or (II), interlayer(s) containing an ultraviolet absorbent is present between at least two light- and heat-sensitive layers and the photopolymerization initiator present in each layer other than the lowermost layer is the compound represented by formula (I) or (II) described above.

Furthermore, the light- and heat-sensitive recording material (A) or (B) of this invention having at least one of the light- and heat-sensitive layers may have a protective layer comprising an organic polymer on the uppermost layer thereof.

Also, in the above-described light- and heat-sensitive recording material having a protective layer, it is preferred for the protective layer to contain therein matting particles and/or a hardening agent for the organic polymer forming the protective layer.

BRIEF DESCRIPTION OF THE DRAWINGS

The spectral characteristics of three kinds of optical filters (BPB-30, BPB-36, and SC-41) used in the exposure of the light- and heat-sensitive recording materials are shown in FIG. 1. The ordinate shows the transmittance (%) and the abscissa shows the wavelength (nm).

The spectral sensitivity curves obtained by using the light- and heat-sensitive recording materials Nos. 14 to 17, 19 and 20 are shown in FIGS. 2 to 7, respectively. The ordinates show the spectral sensitivity (arbitrary scale) and the abscissae show the wavelength (nm).

DETAILED DESCRIPTION OF THE INVENTION

Figure 1:
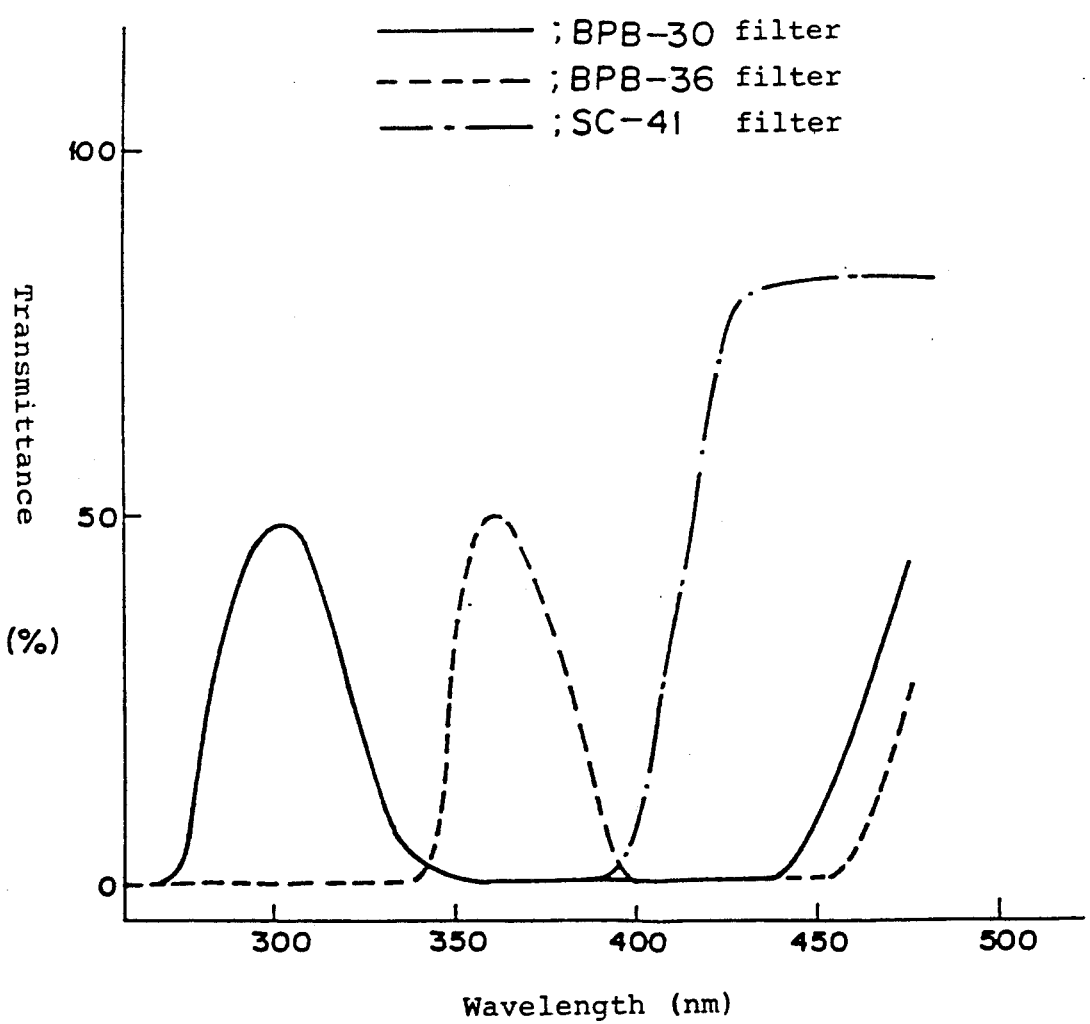
Figure 2:
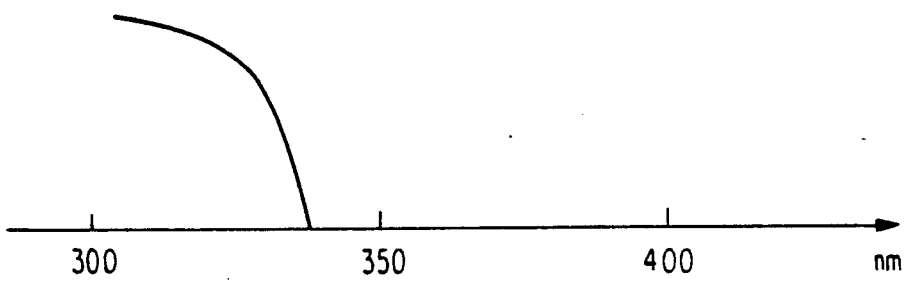
Figure 3:
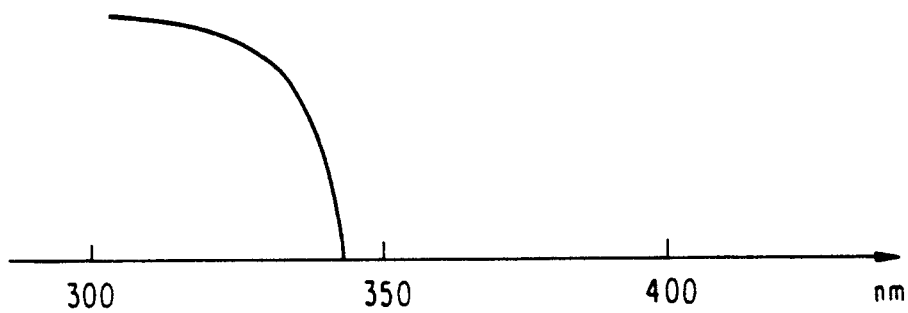
Figure 4:
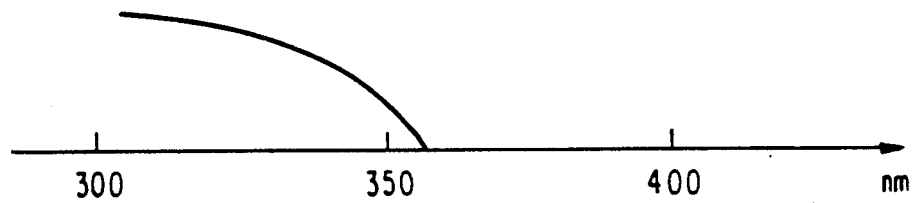
Figure 5:
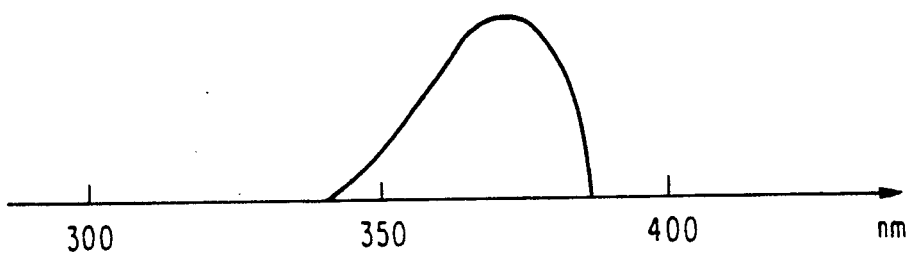
Figure 6:
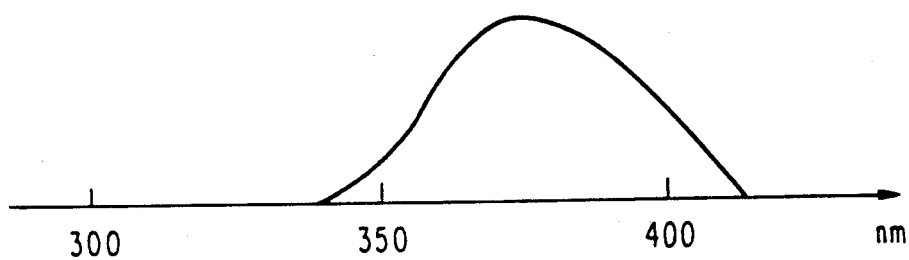
Figure 7:
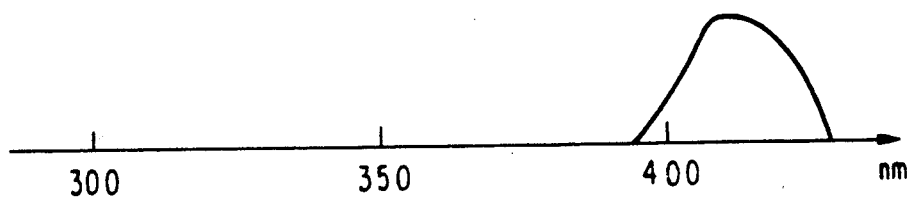

In an embodiment of this invention, the light- and heat-sensitive recording material (A) or (B) has a protective layer as the uppermost layer as described above. In this case, diffusion of the electron acceptive compound (developer or polymerizable vinyl monomer) is only within the light- and heat-sensitive recording material to reduce the formation of stains on the original for adhesion-expose and/or heating rollers or the like on heat-developing.

When the protective layer contains therein matting agent, direct contact of the light- and heat-sensitive layer with an original and/or heating rollers is prevented reducing the formation of stains.

Also, when the protective layer contains therein a hardening agent for the binder, in a preferred embodiment of this invention as described above, the plasticization of the binder by water or the electron acceptive compound is inhibited. As a result, the formation of stains on the original and/or heating rollers is reduced to an even greater extent.

Thus, the construction of the light- and heat-sensitive layers of this invention can be selected depending on the purposes of use.

In one of the preferred constructions, a layer composed of fine liquid drops of the above-described light-hardenable composition and microcapsules containing an electron donative colorless dyes are formed on a support. In this case, the fine liquid drops may be present in the form of an emulsion or core materials of the microcapsules. Furthermore, a binder may be present in this layer.

In other preferred construction, a layer composed of a continuous phase of the above-described light-hardenable composition and microcapsules containing an electron donative colorless dye present in a continuous phase is provided on a support. The continuous phase may be a mixture of the light-hardenable composition and a binder.

Also, in another preferred embodiment of this invention, a light- and heat-sensitive layer containing the above-described light-hardenable composition and microcapsules containing an electron donative colorless dye in a continuous phase mainly composed of a binder may be formed on a support.

The recording material (A) or (B) of this invention may be a monochromatic black and white recording material or a multilayer recording material each having light- and heat-sensitive layer(s) described above. In the case of a multicolor recording material, a multilayer structure with each layer comprising microcapsules each containing an electron donative colorless dye forming a color of a different hue and a light-hardenable composition sensitive to light of different wavelength can be employed.

More specifically, a construction where a layer comprising microcapsules containing an electron donative colorless dye forming a cyan color and a light-hardenable composition sensitive to wavelength $\lambda_1$ is formed on a support, a layer comprising microcapsules containing an electron donative colorless dye forming a magenta color and a light-hardenable composition sensitive to wavelength $\lambda_2$ is formed on the aforesaid layer, and a layer comprising microcapsules containing an electron donative colorless dye forming a yellow color and a light-hardenable composition sensitive to wavelength $\lambda_3$ is further formed on the layer can be employed, in which 300 nm$<\lambda_3<\lambda_2<\lambda_1$450 nm. Furthermore, an interlayer may be formed between each two layers or the interlayer may contain an ultraviolet absorbent in the aforesaid construction.

As a specific example of employing the aforesaid interlayers, a construction where a layer comprising microcapsules containing an electron donative colorless dye forming a cyan color and a light-hardenable composition sensitive to wavelength $\lambda_1$ is formed on a support, an interlayer absorbing light of shorter wavelengths than $\lambda_1$ is formed on the layer, a layer comprising microcapsules containing an electron donative colorless dye forming a magenta color and a light-hardenable composition sensitive to wavelength $\lambda_2$ is formed on the interlayer, an interlayer absorbing light of shorter wavelengths than the wavelength $\lambda_2$ is formed on this layer, a layer comprising microcapsules containing an electron donative colorless dye forming a yellow color and a light-hardenable composition sensitive to wavelength $\lambda_3$ is formed on the interlayer, and further a protective layer is formed on this layer.

As described above, the light- and heat-sensitive layer of the recording material according to the present invention comprises microcapsules containing an electron donative colorless dye and a light hardenable composition outside thereof, which light hardenable composition includes to embodiments.

That is, in the recording material (A) of one embodiment, the light hardenable composition comprises a polymerizable vinyl monomer, a photopolymerization initiator and an electron acceptive developer. In this case, the developer transferred by heating is reacted with the colorless dye inside microcapsules to overall develop color while the developed dye is discolored by the polymerizable vinyl monomer in the unexposed portion, whereby a negative image can be obtained.

The polymerizable vinyl monomer which can be used for the light-hardenable composition in the recording material (A) of this invention is a polymerizable compound having at least one ethylenically unsaturated double bond in the molecule. Examples of suitable polymerizable vinyl monomers are acrylic acid and the salts thereof, acrylic acid esters, acrylamides, methacrylic acid and the salts thereof, methacrylic acid esters, itaconic acid, itaconic acid esters, styrenes, vinyl ethers, vinyl esters, N-vinyl heterocylcic rings, aryl ethers, and aryl esters.

Of these compounds, a polymerizable vinyl monomer having at least one atom such as nitrogen and oxygen with unpaired electron(s), which atom is preferably present in a bonding selected from the group of ester bond, amide bond, amine bond, carbonyl bond and ether bond in the molecule, exhibiting a strong interaction with an electron acceptive developer is more preferred. Examples of such compound include diacetone (meth)acrylamide and (meth)acrylate ester of polyethylene glycol monoalkyl ether.

Also, for advantageously improving the polymerization efficiency (hardening speed), a polymerizable compound with a plurality of ethylenically unsaturated double bonds in the molecule is preferred. Examples of these compounds are acrylic acid esters or methacrylic acid esters of a polyhydric alcohol such as trimethylolpropane, pentaerythritol, etc.; acrylate- or methacrylate-terminated epoxy resins; and acrylate- or methacrylate-terminated polyesters. Specific examples of particularly preferred compounds are ethylene glycol diacrylate, ethylene glycol dimethacrylate, trimethylolpropane triacrylate, pentaerythritol tetraacrylate, dipentaerythritol hydroxypentaacrylate, hexanediol-1,6-dimethacrylate, and diethylene glycol dimethacrylate.

The molecular weights of these polymerizable monomers are from about 100 to about 5,000 but the polymerizable monomer which has a low tendency to thermally diffuse into microcapsules containing an electron donative colorless dye, and hence the polymerizable vinyl monomer having a molecular weight of from 200 to 1,000 is most effectively used.

Suitable electron acceptive developers which can be used in the recording material (A) of this invention are phenol derivatives, sulfur-containing phenol derivatives, organic carboxylic acid derivatives (e.g., salicylic acid, stearic acid, and resorcinic acid) and the metal salts thereof, sufonic acid derivatives, urea derivatives, thiourea derivatives acid clay, bentonite, novolak resins, metal-treated novolak resins, metal complexes, etc. Specific examples thereof are described in *Paper Pulp Technology Times*, 49–54 and 65–70 (1985), JP-B No. 40-9309 and JP-B No. 45-14039, JP-A No. 52-140483 (corresponding to U.S. Pat. No. 4,138,357), JP-A No. 48-51510, JP-A No. 57-210886 (corresponding to U.S. Pat. No. 4,453,744), JP-A No. 58-87089, JP-A No. 59-11286 (corresponding to U.S. Pat. No. 4,513,302), JP-A No. 60-176795 (corresponding to U.S. Pat. No. 4,682,193), and JP-A No. 61-95988.

Specific examples of the electron acceptive developers are phenolic compounds such as 2,2'-bis(4-hydroxyphenyl)-propane, 4-t-butylphenol, 4-phenylphenol, 4-hydroxydiphenoxide, 1,'-bis(3-chloro-4-hydroxyphenyl)cyclohexane, 1,1'-bis(4-hydroxyphenyl)cyclohexane, 1,1'-bis(3-chloro-4-hydroxyphenyl)-2-ethylbutane, 4,4'-sec-isooctylidene diphenol, 4-p-methylphenylphenol, 4,4'-methylcyclohexylidenephenol, 4,4'-isopentylidenephenol, benzyl p-hydroxybenzoate, etc.; salicylic acid derivative such as 4-pentadecylsalicylic acid, 3,5-di(α-methylbenzyl)salicylic acid, 3,5-di(tertoctyl)salicylic acid, 5-octadecylsalicylic acid, 5-α-(p-α-methylbenzylphenyl)ethylsalicylic acid, 3-α-methylbenzyl-5-tert-ocrylsalicylic acid, 5-tetradecylsalicylic acid, 4-hexyloxysalicylic acid, 4-cyclohexyloxysalicylic acid, 4-decyloxysalicylic acid, 4-dodecyloxysalicylic acid, 4-pentadecyloxysalicylic acid, 4-octadecyloxysalicylic acid, and the zinc, aluminum, calcium, copper, and lead salts thereof.

These electron acceptive developer can be used alone or as a combination thereof. The amount of the electron acceptive developer is in the range of, preferably from 10% to 4000% by weight, and particularly preferably from 100% to 2000% by weight of the amount of the electron donative colorless dye used therewith.

On the other hand, in the recording material (B) of another embodiment, the light hardenable composition comprises an electron acceptive polymerizable vinyl monomer and a photopolymerization initiator. In this case, the vinyl monomer in the unexposed portion is transferred by heating and reacted with the colorless dye inside microcapsules to develop color whereby a positive image can be obtained.

Suitable electron acceptive polymerizable vinyl monomer for use in the recording material (B) of this invention are compounds having an electron acceptive group and an ethylenically unsaturated bond in the molecule. As such a compound, there are the methacryloxyethyl ester of benzoic acid having a hydroxy group described in JP-A No. 63-173682 and acryloxyethyl esters which can be synthesized by the similar synthesis methods as the aforesaid ester; the esters of benzoic acid having a hydroxy group and hydroxymethylstyrenes described in JP-A No. 59-83693, JP-A No. 60-141587, and JP-A No. 62-99190; the hydroxystyrene described in European Patent No. 29,323; the N-vinylimidazole complexes of zinc halides described in JP-A No. 62-167077 and JP-A No. 62-16708; and various compounds capable of being synthesized by referring to the developer monomers described in JP-A No. 63-317558.

Specific examples thereof are styrenesulfonylaminosalicylic acid, vinylbenzyloxyphthalic acid, zinc $\beta$-methacryloxyethoxysalicylate, zinc $\beta$-acryloxyethoxysalicylate, vinyloxyethyloxybenzoic acid, $\beta$-methacryloxyethyl orsellinate, $\beta$-acryloxyethyl orsellinate, $\beta$-methacryloxyethoxyphenol, $\beta$-acryloxyethoxyphenol, $\beta'$-methacryloxyethyl-$\beta$-resorcinate, $\beta$-acryloxyethyl-$\beta$-resorcinate, hydroxystyrenesulfonic acid-N-ethylamide, $\beta$-methacryloxypropyl-p-hydroxybenzoate, $\beta$-acryloxypropyl-p-hydroxybenzoate, methacryloxymethylphenol, acryloxymethylphenol, methacrylamidopropanesulfonic acid, acrylamidopropanesulfonic acid, $\beta$-methacryloxyethoxy-dihydroxybenzene, $\beta$-acryloxyethoxy-dihydroxybenzene, $\gamma$-styrenesulfonyloxy-$\beta$-methacryloxypropanecarboxylic acid, $\gamma$-acryloxypropyl-$\alpha$-hydroxyethyloxysalicylic acid, $\beta$-hydroxyethoxycarbonylphenol, $\beta$-methacryloxyethyl-p-hydroxy cinnamate, $\beta$-acryloxyethyl-p-hydroxy cinnamate, 3,5-distyrenesulfonic acid amidophenol, methacryloxyethoxyphthalic acid, acryloxyethoxyphthalic acid, methacrylic acid, acrylic acid, methacryloxyethoxyhydroxynaphthoic acid, acryloxyethoxyhydroxynaphtoic acid, 3-$\beta$-hydroxyethoxyphenol, $\beta$-methacryloxyethyl-p-hydroxybenzoate, $\beta$-acryloxyethyl-p-hydroxybenzoate, $\beta$-methacryloxyethyl-$\beta$-resorcinate, methacryloxyethyloxycarbonylhydroxybenzoic acid, $\beta$-acryloxyethyloxycarbonylhydroxybenzoic acid, N,N'-di-$\beta$-methacryloxyethylaminosalicylic acid, N,N'-di-$\beta$-acryloxyethylaminosalicylic acid, N,N'-di-$\beta$-methacryloxyethylaminosulfonylsalicylic acid, N,N'-di-$\beta$-acryloxyethylaminosulfonylsalicylic acid, and the metal salts, preferably zinc salts thereof.

Also in the case of the recording material (B), if desired, non-polymerizable compounds of the above-described electron acceptive developer to be used for the recording material (A) may be contained in the light-hardenable composition in order to increase color densities.

Such compounds include phenol derivatives, salicylic acid derivatives, the metal salts of aromatic carboxylic acid, acid clay, bentonite, novolak resins, metal-treated novolak resins, metal complexes, etc. The amount thereof is in the range of, preferably from 5% to 100% by weight of the amount of the electron donative colorless dye used therewith.

Furthermore, the light-hardenable composition in the recording material (B) may contain the above-described polymerizable compounds having ethylenically unsaturated double bond(s) to be used for the recording material (A), if desired.

Suitable photopolymerization initiators which can be used in this invention are compounds capable of initiating the photopolymerization of the above-described compound having at least one ethylencially unsaturated bond, these can be used alone or as a combination thereof.

In one embodiment of the present invention, the photopolymerization initiator preferably used in the light-hardenable composition present in at least one of the light- and heat-sensitive layers may be a compound represented by formula (I) or (II);

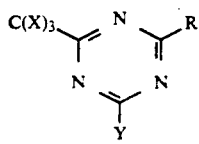

(I)

wherein X represents a halogen atom such as chlorine, bromine and fluorine; Y represents $-C(X)_3$, $-NH_2$, $-NHR'$, $-N(R')_2$, or $-OR'$ (wherein R' represents an alkyl group, a substituted alkyl group, an aryl group, or a substituted aryl group); and R represents $-C(X)_3$, an alkyl group, a substituted alkyl group, an aryl group, a substituted aryl group, or a substituted alkenyl group.

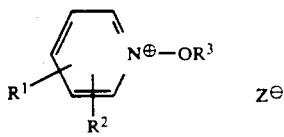

(II)

wherein $R^1$ represents an alkyl group, a substituted alkyl group, an aryl group, a substituted aryl group, a substituted alkenyl group, $R^4CO$, or $R^4OCO$ (wherein $R^4$ represents an alkyl group, a substituted alkyl group, an aryl group, or a substituted aryl group); $R^2$ represents a hydrogen atom, an alkyl group, a substituted alkyl group, an aryl group, or a substituted aryl group; $R^1$ and $R^2$ may form together an aromatic ring structure; $R^3$ represents an alkyl group or a substituted alkyl group; and Z represents a counter anion.

In the above formulae, each group may have 1 to 10 carbon atoms and typical substituent is a substituted phenyl group.

Examples of compounds shown by formula (I) described above are the compounds described in Wakabayashi, et al, Bull. Chem. Soc. Japan, 42, 2924 (1969), such as, e.g., 2-phenyl-4,6-bis(trichloromethyl)-s-triazine, 2-(p-chlorophenyl)-4,6-bis(trichloromethyl)-s-triazine, 2-(p-tolyl)-4,6-bis(trichloromethyl)-s-triazine, 2-(p-methoxyphenyl)-4,6-bis(trichloromethyl)-s-triazine, 2-(2',4',-di-chlorophenyl)-4,6-bis(trichloromethyl)-s-triazine, 2,4,6-tris(trichloromethyl)-s-triazine, 2-methyl-4,6-bis(trichloromethyl)-s-triazine, 2-n-nonyl-4,6-bis(trichloromethyl)-s-triazine, and 2-(α,α,β-trichloroethyl)-4,6-bis(trichloromethyl)-s-triazine; the compounds described in British Patent No. 1,388,492, such as, e.g., 2-styryl-4,6-bis(trichloromethyl)-s-triazine, 2-(p-methylstyryl)-4,6-bis(trichloromethyl)-s-triazine, 2-(p-methoxystyryl)-4,6-bis(trichloromethy)-s-triazine, and 2-(p-methoxystyryl)-4-amino-6-trichloromethyl-s-triazine; the compounds described in JP-A No. 53-133428, such as, e.g., 2-(4-methoxy-naphth-1-yl)4,6-bis-trichloromethyl-s-triazine, 2-(4-ethoxy-naphth-1-yl)-4,6-bis-trichloromethyl-s-triazine, 2-[4-(2-ethoxyethyl)-naphth-1-yl]4,6-bis-trichloromethyl-s-triazine, 2-(4,7-dimethoxy-naphth-1-yl)-4,6-bis-trichloromethyl-s-triazine and 2-(acenaphthyl)-4,6-bis-trichloromethyl-s-triazine; and the compounds described in German Patent 3,337,024, such as, e.g.,

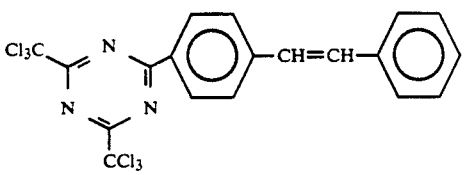

and

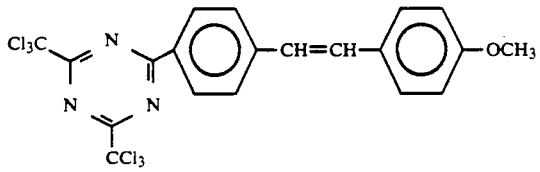

Also, the compounds described in F. C. Schaefer, et al, Journal of Organic Chemistry, 29, 1527 (1964), such as, e.g., 2-methyl-4,6-bis(tribromomethyl)-s-triazine, 2,4,6-tris(tribromomethyl)-s-triazine, 2,4,6-tris(dibromomethyl)-s-triazine, 2-amino-4-methyl-6-tribromomethyl-s-triazine, and 2-methoxy-4-methyl-6-trichloromethyl-s-triazine can be used as the photopolymerization initiator of formula (I).

Furthermore, the compounds described in JP-A No. 62-58241 can be also used as the compound of formula (I).

In this invention, the compounds of formula (I) wherein Y is $-C(X)_3$ are particularly preferred. Specific examples of particularly preferred compounds are 2-(p-methoxyphenyl)-4,6-bis(trichloromethyl)-s-triazine, 2-(p-methoxycarbonylphenyl)-4,6-bis(trichloromethyl)-s-triazine, 2-(p-chlorophenyl)-4,6-bis(trichloromethyl)-s-triazine, and 2-styryl-4,6-bis(trichloromethyl)-s-triazine.

Suitable examples of compounds shown by the above-described formula (II) are the compounds described in British Patent No. 2,083,832A and Research Disclosure, Vol. 200, No. 20036, (December, 1980), such as, e.g., N-methoxy-4-phenylpyridinium tetrafluoroborate, N-methoxy-4-phenylpyridinium hexafluorophosphate, N-ethoxy-4-phenylpyridinium hexafluorophosphate, N-butoxy-4-phenylpyridinium hexafluorophosphate, N-methoxy-4-methylpyridinium p-toluenesulfonate, N-benzyloxy-2-methylpyridinium bromide, N-ethoxy-2-methylquinolinium tetrafluoroborate, N-methoxy-4-(p-chlorophenyl)pyridinium hexafluorophosphate, N-methoxy-4-(p-methoxyphenyl) pyridinium hexafluorophosphate, N-methoxy-4-styrylpyridinium hexafluorophosphate,

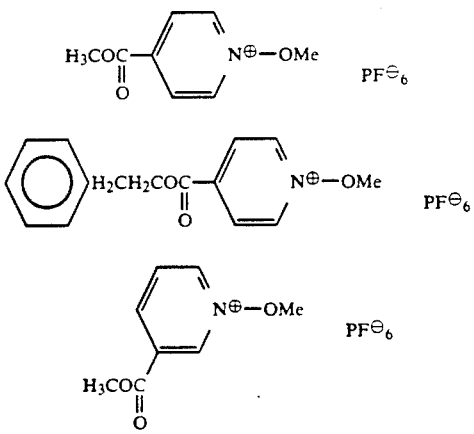

Examples of particularly preferred compounds shown by formula (II) are N-methoxy-4-phenylpyridinium hexafluorophosphate, N-methoxy-4-(p-methoxyphenyl) pyridinium hexafluorophosphate, N-methoxy-2-methylquinolinium hexafluorophosphate, and N-methoxy-4-styrylpyridinium hexafluorophosphate.

In this invention, as the photopolymerization initiator being used for the light-hardenable composition, compounds of formula (I) or (II) and/or conventionally know photopolymerization initiators or combinations of them and spectral sensitizing dyes can be used. Examples of preferred photopolymerization initiators other than those of formula (I) or (II), which can be used in this invention, are aromatic ketones such as benzophenone, 4,4'-bis(dimethylamino)-benzophenone, 4-methoxy-4'-dimethylaminobenzophenone, 4,4'-dimethoxybenzophenone, 4-dimethylaminobenzophenone, 4-dimethylaminoacetophenone, benzylanthraquinone, 2-tert-butylanthraquinone, 2-methylanthraquinone, xanthone, thioxanthone, 2-chlorothioxanthone, 2,4-diethylthioxanthone, fluorenone, and acridone; benzoin and benzoin ethers such as benzoin methyl ether, benzoin ethyl ether, benzoin isopropyl ether and benzoin phenyl ether; 2,4,5-triarylimidazole dimers such as 2-(o-chlorophenyl)-4,5-diphenylimidazole dimer, 2-(o-chlorophenyl)-4,5-di(m-methoxyphenyl)imidazole dimer, 2-(o-fluorophenyl)-4,5-diphenylimidazole dimer, 2-(o-methoxyphenyl)-4,5-diphenylimidazole dimer, and 2-(p-methoxyphenyl)4,5-diphenylimidazole dimer; polyhalogen compounds such as carbon tetrabromide, phenyltribromomethylsulfone, and phenyltrichloromethyl ketone; the compounds described in JP-A No. 53-133428 (corresponding to U.S. Pat. No. 4,189,323), JP-B No. 57-1819 and JP-B No. 57-6096 (the term "JP-B" as used herein means an "examined published Japanese patent application"), and U.S. Pat. No. 3,615,455; s-triazine derivatives having a trihalogen-substituted methyl group described in JP-A No. 58-29803, such as 2,4,6-tris(trichloromethyl)-s-triazine and 2-amino-4,6-bis(trichloromethyl)-s-triazine; the organic peroxides described in JP-A No. 59-189340, such as, e.g., methyl ethyl ketone peroxide, cyclohexanone peroxide, 3,3,5-trimethylcyclohexanone peroxide, benzoyl peroxide, di-tert-butyl di-peroxy isophthalate, 2,5-dimethyl-2,5-di(benzylperoxy)-hexane, tert-butyl peroxybenzoate, α,α'-bis(tert-butyl peroxyisopropyl)-benzene, dicumyl peroxide, 3,3',4,4'-tetra-(tert-butyl peroxycarbonyl) benzophenone; the organic boron compounds described in European Patent No. 223587, such as, e.g., the tetramethyl ammonium salt of triphenylbutyl borate, the tetrabutyl ammonium salt of triphenylbutyl borate and the tetramethyl ammonium salt of tri(p-methoxyphenyl)-butyl borate; and other well known photopolymerization initiators such as diaryl iodonium salts and iron allene complexes.

Of these photopolymerization initiators, particularly preferred compounds are benzoin ethers, s-triazine derivatives having a trihalogen-substituted methyl group, organic peroxides, azinium salt compounds, and organic boron compounds.

The amount of the photopolymerization initiator is from 0.01% to 20% by weight, more preferably from 0.2% to 15% by weight, and most preferably from 1% to 10% by weight based on the total amount of the light-hardenable composition. If the amount thereof is less than 0.01% by weight, the insufficient sensitivity results and if the amount is over 10% by weight, a further increase of sensitivity is not obtained.

The light-hardenable composition for use in this invention may further contain a spectral sensitizing dye for controlling the sensitive wavelength in addition to the photopolymerization initiator.

Suitable spectral sensitizing dyes include various compounds well known in the art. Examples of suitable spectral sensitizing dyes are described in the patents described above in regard to the photopolymerization initiators, Research Disclosure, Vol. 200, No. 20036, (December, 1980), and Katsumi Tokumaru and Shin Ookawara, Zokanzai (Sensitizers), pages 160 to 163, published by Kodansha, 1987.

Specific examples of suitable spectral sensitizing dyes are 3-ketocoumarin compounds described in JP-A No. 58-15503, thiopyrylium salts described in JP-A No. 58-40302, naphthothiazole merocyanine compounds described in JP-B No. 59-28328 (corresponding to U.S. Pat. No. 4,239,850) and JP-B No. 60-53300 (corresponding to U.S. Pat. No. 4,258,123), and merocyanine compounds described in JP-B No. 61-9621 and JP-B No. 62-3842 (corresponding to U.S. Pat. No. 4,399,211), JP-A No. 59-89303 (corresponding to U.S. Pat. No. 4,481,276) and JP-A No. 60-60104.

By these spectral sensitizing dyes, the spectral sensitivity of a photopolymerization initiator can be extended to a visible wavelength region.

Combinations of the spectral sensitizing dyes and trihalomethyl-s-triazine compounds are shown in JP-A No. 59-89303 and JP-A No. 60-60104 but the spectral sensitizing dyes may be combined with other photopolymerization initiators.

Spectral sensitizing dyes which can be used in this invention include coumarin dyes (including ketocoumarin and sulfono-coumarin dyes) which are keto dyes, merostyryl dyes, oxonol dyes, hemioxonol dyes, non-ketopolymethine dyes which are non-keto dyes, anthracene dyes, rhodamine dyes, acrridine dyes, aniline dyes, azo dyes, cyanine, hemicyanine and styryl dyes, as non-ketopolymethine dyes.

Also, the light-hardenable composition for use in this invention can further contain a reducing agent such as an oxygen scavenger and a chain transfer agent for an active hydrogen doner as an assistant for further accelerating the polymerization and additionally other compounds accelerating polymerization with chain transfer.

Useful oxygen scavengers, are phosphine, phosphonats, phosphites, stannous salts, and other compounds capable of being easily oxidized by oxygen such as N-phenylglycine, trimethylbarbituric acid, N,N-dimethyl-2,6-diisopropylaniline, N,N,N-2,4,6-pentamethylaniline, etc.

Furthermore, thiols, thioketones, trihalomethyl compounds lophine dimer compounds, iodonium salts, sulfonium salts adinium salts, organic peroxides, etc., are useful as polymerization accelerators.

Furthermore, the light-hardenable composition for use in this invention can contain, if desired, a thermal polymerization inhibitor in addition to the above-described compounds. The thermal polymerization inhibitor is added to inhibit thermal polymerization or polymerization with the passage of time of the light-hardenable composition and, due to the presence thereof, the chemical stability of the light-hardenable composition on preparation and on storage can be increased. Examples of suitable thermal polymerization inhibitors are p-methoxyphenol, hydroquinone, t-butylcatechol, pyrogallol, 2-hydroxybenzophenone, 4-methoxy-2-hydroxybenzophenone, cuprous chloride, phenothiazine, chloranyl, naphthylamine, β-naphthol, 2,6-di-t-butyl-p-cresol, nitrobenzene, dinitrobenzene, picric acid, and p-toluidine.

The amount of the thermal polymerization inhibitor employed is preferably from 0.001% to 5% by weight, and more preferably from 0.01% to 1% by weight based on the total amount of the light-hardenable composition. If the amount is less than 0.001% by weight, the composition has inferior heat stability and if it is over 5% by weight, sensitivity is reduced.

Furthermore, in the case of the recording material (B), light-crosslinkable compositions such as polyvinyl cinnamate, polyvinyl cinnamirydene acetate and light-sensitive resin with u-phenyl maleimide group may be added to the light-hardenable composition.

The light-hardenable composition in this invention may be, if desired, encapsulated in micro-capsules as disclosed, e.g., in European Patent No. 223,587, etc.

Suitable electron donative colorless dyes which can be used in this invention are triphenylmethane phthalide series compounds, fluoran series compounds, phenothiazine series compounds, indolyl phthalide series compounds, leucoauramine series compounds, rhodaminelactam series compounds, triphenylmethane series compounds, triazene series compounds, spiropyran series compounds, fluorene series compounds, etc.

Specific examples of phthalides are described in U.S. Reissue Pat. No. 23,024, U.S. Pat. Nos. 3,491,111, 3,491,112, 3,491,116, and 3,509,174; specific examples of the fluoranes are described in U.S. Pat. Nos. 3,624,107, 3,627,787, 3,641,011, 3,462,828, 3,681,390, 3,920,510, and 3,959,571; specific examples of the spiropyrans are described in U.S. Pat. No. 3,971,808; specific examples of pyridine series and pyrazine series compounds are described in U.S. Pat. Nos. 3,775,424, 3,853,869, and 4,246,318; and specific examples of fluorene series compounds are described in JP-A No. 63-94878.

Particular examples of these electron donative colorless dyes are triarylmethane series compounds such as 3,3-bis(p-dimethylaminophenyl)-3-dimethylaminophthalide, 3,3-bis(p-dimethylaminophenyl)phthalide, 3-(p-dimethylaminophenyl)-3-(1,3-dimethylindol-3-yl)-phthalide, 3-(p-dimethylaminophenyl)-3-(2-methylindol-3-yl)phthalide, etc.; diphenylmethane series compounds such as 4,4'-bis-dimethylaminobenzhydrin benzyl ether, N-halophenyl-leucoauramine, N-2,4,5-trichlorophenylleucoauramine, etc.; xanthene series compounds such as rhodamine-B-anilinolactam, rhodamine(p-nitrino)lactam, 2-(dibenzylamino)fluoran, 2-anilino-3-methyl-6-diethylaminofluoran, 2-anilino-3-methyl-6-dibutylaminofluoran, 2-anilino-3-methyl-6-N-ethyl-N-isoaminofluoran, 2-anilino-3-methyl-6-N-methyl-N-cyclohexylaminofluoran, 2-anilino-3-chloro-6-diethylaminofluoran, 2-anilino-3-methyl-6-N-ethyl-N-isobutylaminofluoran, 2-anilino-6-dibutylaminofluoran, 2-anilino-3-methyl-6-N-methyl-N-tetrahydrofurfurylaminofluoran, 2-anilino-3-methyl-6-piperidinoaminofluoran, 2-(o-chloroanilino)-6-diethylaminofluoran, 2-(3,4-dichloroanilino)-6-diethylaminofluoran, etc.; thiazine series compounds such as benzoyl leucomethylene blue, p-nitrobenzyl leucomethylene blue, etc.; and spiro series compounds such as 3-methyl-spiro-dinaphthopyran, 3-ethyl-spiro-dinaphthopyran, 3,3'-dichloro-spiro-dinaphthopyran, 3-benzylspiro-dinaphthopyran, 3-methyl-naphtho-(3-methoxybenzo)-spiropyran, 3-propyl-spiro-dibenzopyran, etc.

In particular, in the case of applying the invention to a full color recording material, electron donative colorless dyes for forming cyan, magenta, and yellow colors are described in U.S. Pat. No. 4,800,149, electron donative colorless dyes for forming yellow colors are described in U.S. Pat. No. 4,800,148, and electron donative colorless dyes for forming cyan colors are described in JP-A No. 63-53542.

The electron donative colorless dye for use in this invention can be encapsulated using methods known in the art.

For example, a method utilizing a coacervation of a hydrophilic wall-forming material as described in U.S. Pat. Nos. 2,800,457 and 2,800,458; an interfacial polymerization method as described in U.S. Pat. No. 3,287,154, British Patent No. 990,443, JP-B No. 38-19574, JP-B No. 42-446, and JP-B No. 42-771; a method of polymer deposition as described in U.S. Pat. Nos. 3,418,250 and 3,660,304; a method using an isocyanate polyol wall-forming material as described in U.S. Pat. No. 3,914,511; a method using a urea-formaldehyde series or urea-formaldehyde-resorcinol series wall-forming material as described in U.S. Pat. Nos. 4,001,140, 4,087,376, and 4,089,802; a method using a wall-forming material such as a melamine-formaldehyde resin, hydroxypropyl cellulose, etc., as described in U.S. Pat. No. 4,025,455; an in situ method involving polymerization of a monomer as described in JP-B No. 36-9168 and JP-A No. 51-9079 (corresponding to U.S. Pat. No. 4,001,140); an electrolysis dispersion cooling method as described in British Patent Nos. 952,807 and 965,074; and a spray drying method as described in U.S. Pat. No. 3,111,407 and British Patent No. 930,422.

In this invention, after emulsifying a core material, it is preferred to form a polymer film or layer on the core materials as a microcapsule wall although the invention is not limited to this technique.

For forming the microcapsule walls for the electron donative colorless dye in this invention, the use of a microcapsulation method involving polymerization of a reactant from inside the oil droplets, described in U.S. Pat. Nos. 3,796,669 and 3,914,511, is particularly effective. That is, microcapsules having a uniform particle size for the recording material with excellent shelf life can be obtained in a short period of time and are preferred.

For example, in using polyurethane as the microcapsule wall, a polyhydric isocyanate and, if desired, a second material forming the microcapsule wall by reaction with the isocyanate (e.g., polyol and polyamine) are mixed with an oily liquid of the electron donative colorless dye as a core material to be microcapsulated, the mixture is emulsion-dispersed in water, and then the temperature of the dispersion is increased, whereby a polymer forming reaction occurs at the interface of the oil droplets to form the microcapsule wall. In this case, a low-boiling auxiliary solvent with a high dissolving power can be used in the oily droplets.

The polyhydric isocyanate and the polyol or polyamine reacted with the isocyanate in this case are described in U.S. Pat. Nos. 3,281,383, 3,773,695, and 3,793,268, JP-B No. 48-40347 and JP-B No. 49-24159, JP-A No. 48-80191 and JP-A No. 48-84086.

Examples of polyhydric isocyanates which can be used in this technique are diisocyanates such as m-phenylene diisocyanate, p-phenylene diisocyanate, 2,6-tolylene diisocyanate, 2,4-tolylene diisocyanate, naphthalene-1,4-diisocyanate, diphenylmethane-4,4'-di-isocyanate, 3,3'-dimethoxy-4,4'-biphenyl diisocyanate, 3,3'-dimethyldiphenylmethane-4,4'-diisocyanate, xylylene-1,4-diisocyanate, 4,4'-diphenylpropane diisocyanate, trimethylene diisocyanate, hexamethylene diisocyanate, propylene-1,2-diisocyanate, butylene-1,2-diisocyanate, cyclohexylene-1,2-diisocyanate, cyclohexylene-1,4-diisocyanate, etc.; triisocyanates such as 4,4',4''-triphenylmethane triisocyanate, toluene-2,4,6-triisocyanate, etc.; tetraisocyanates such as 4,4'-dimethyldiphenylmethane-2,2',5.5'-tetraisocyanate, etc.; and isocyanate prepolymers such as the addition product of hexamethylene diisocyanate and trimethylolpropane, the addition product of 2,4-tolylene diisocyanate and trimethylolpropane, the addition product of xylylenediisocyanate and trimethylol propane, the addition product of tolylene diisocyanate and trimethylolpropane, the addition product of xylylenediisocyanate and trimethylol propane, the addition product of tolylene diisocyanate and hexanetriol, etc.

Suitable polyols which can be used are aliphatic and aromatic polyhydric alcohols, hydroxypolyesters, hydroxypolyalkylene ethers, etc.

The following polyols described in JP-A No. 60-49991 can be used in this invention ethylene glycol, 1,3-propanediol, 1,4-butanediol, 1,5-pentanediol, 1,6-hexanediol, 1,7-heptanediol, 1,8-octanediol, propylene glycol, 2,3-dihydroxybutane, 1,2-dihydroxybutane, 1,3-dihydroxybutane, 2,2-dimethyl-1,3-propanediol, 2,4-pentanediol, 2,5-hexanediol, 3-methyl-1,5-pentanediol, 1,4-cyclohexanedimethanol, dihydroxycyclohexane, diethylene glycol, 1,2,6-trihydroxyhexane, 2-phenylpropylene glycol, 1,1,1-trimethylolpropanehexanetriol, pentaerythritol, pentaerythritol-ethylene oxide addition product, glycerol-ethylene oxide addition product, glycerol, 1,4-di(2-hydroxyethoxy)benzene, resorcinol dihydroxyethyl ether, p-xylylene glycol, m-xylylene glycol, α,α'-dihydroxy-p-diisopropylbenzene, 4,4'-dihydroxydiphenylmethane, 2-(p,p'-dihydroxydiphenylmethyl)benzylalcohol, the addition product of bisphenol A and ethylene oxide, the addition product of bisphenol A and propylene oxide, etc.

The polyol is preferably used in a ratio of from 0.02 to 2 moles of hyroxy group per mole of an isocyanate group.

Suitable polyamines which can be used are ethylenediamine, trimethylenediamine, pentamethylenediamine, hexamethylenediamine, p-phenylenediamine, m-phenylenediamine, piperazine, 2-methylpiperazin, 2,5-dimethylpiperazine, 2-hydroxytrimethylenediamine, diethylenetriamine, triethylenetriamine, triethylenetetramine, diethylaminopropylamine, tetraethylenepentamine, an amine addition product of an epoxy compound, etc.

A water-soluble polymer can be used as a protective colloid for forming microcapsules, and an anionic polymer, a nonionic polymer or an amphoteric polymer can be used as the water-soluble polymer.

A natural or synthetic anionic polymer can be used and examples thereof are those having —COO—, —$SO^2$—, etc.

Typical examples of anionic natural polymers are gum arabic, alginic acid, pectin, etc., and examples of semi-synthetic anionic polymer are carboxymethyl cellulose, phthalated gelatin, sulfated starch, sulfated cellulose, ligninesulfonic acid, etc.

Also, examples of synthetic anionic polymers are maleic anhydride series copolymers (including hydrolyzed copolymers), acrylic acid series polymers or copolymers (including those of the methacrylic acid series), vinylbenzenesulfonic acid series polymers and copolymers, and carboxy-denatured polyvinyl alcohol.

Examples of typical nonionic polymers are polyvinyl alcohol, hydroxyethyl cellulose, methyl cellulose, etc.

Examples of amphoteric polymers are gelatin, etc.

The above-described water-soluble polymer can be used as an aqueous solution of from 0.01% to 10% by weight thereof.

Also, the particle sizes of the microcapsules are adjusted to 80 μm or lower.

As described above, the sizes of the microcapsules for use in this invention are 80 μm or lower and in particular, from the standpoint of storage stability and handlability, the sizes thereof are preferably 20 μm or lower, more preferably 5 μm or lower. Also, if the sizes of the microcapsules are too small, the surface area for a specific solids content becomes larger and a large amount of materials for forming the walls of the microcapsules is required. Thus, the lower limit of the sizes thereof is preferably about 0.1 μm.

The electron donative colorless dye for use in this invention may be present in the microcapsules in a solution state or a solid state. Where the electron donative colorless dyes are present in a solution state, the amount of the solvent present in the microcapsule is preferably from 1 to 500 parts by weight per 100 parts by weight of the electron donatic colorless dye. In the case of solid state, the solid core material is dispersed to be capsulated as oily liquid, followed by evaporation of dispersion medium.

Suitable solvents which can be used are natural oils and synthetic oils. Specific examples of solvents are cotton seed oil, kerosene, aliphatic ketones, aliphatic esters, paraffin, naphthene oil, alkylated biphenyl, alkylated terphenyl, chlorinated paraffin, alkylated naphthalene, 1-phenyl-1-xylylethane, 1-phenyl-1-phenylethane, 1,1'-ditolylethane, phtnalic acid alkyl esters (e.g., dibutyl phthalate, dioctyl phthalate, and dicyclohexyl phthalate), phosphoric acid esters (e.g., diphenyl phosphate, triphenyl phosphate, tricresyl phosphate, and dioctylbutyl phosphate), citric acid esters (e.g., tributyl acetylcitrate), benzoic acid esters (e.g., octyl benzoate), alkylamides (e.g., diethyllaurylamide), fatty acid esters (e.g., dibutoxyethyl succinate and dioctyl azerate), trimesic acid esters (e.g., tributyl trimesate), lower alkyl acetates (e.g., ethyl acetate and butyl acetate), ethyl propionate, secondary butyl alcohol, methyl isobutyl ketone, β-ethoxyethyl acetate, methylcellosolve acetate, and cyclohexanone.

Also, during microcapsulation, a volatile solvent may be used as an auxiliary solvent for dissolving the electron donative colorless dye. Examples of suitable auxiliary solvents are ethyl acetate, butyl acetate, and methylene chloride.

These solvents may be used alone or together with each other.

In one embodiment of this invention, an interlayer containing an ultraviolet absorbent is formed between two light- and heat-sensitive layers to restrain light reaching the lower light- and heat-sensitive layer, thereby overlap region of the light-sensitive wavelength is eliminated.

Conventionally known methods can be used to introduce an ultraviolet absorbent.

For example, a so-called emulsion dispersing method comprising dissolving an ultraviolet absorbent in a water-immiscible organic solvent, emulsion-dispersing the solution in an aqueous dispersion medium containing a surface active agent to form fine liquid drops containing the ultraviolet absorbent, and introducing the emulsified dispersion into a coating composition for the interlayer can be used.

In this method, sometimes the organic solvent or the surface active agent in the interlayer acts upon the adjacent light- and heat-sensitive layer(s) and reduces the coloring density.

Also, a method comprising introducing a polymer latex containing an ultraviolet absorbent into the interlayer can be used. The polymer latex containing an ultraviolet absorbent can be obtained using methods known in the art. For example, an ultraviolet absorbent can be dissolved in a water-immiscible volatile organic solvent, the solution is emulsion-dispersed in an aqueous dispersion medium containing a surface active agent to form fine liquid drops containing the ultraviolet absorbent, and the emulsified dispersion is mixed with a polymer latex.

In this method sometimes the surface active agent adversely influences the adjacent light- and heat-sensitive layer(s) depending on the amount and nature of the surface active agent.

Another method comprises introducing a polymer latex containing an ultraviolet absorbent as a polymer component into the interlayer. This method is most preferred since the smallest amount of surface active can be used thereby the adverse influence of the surface active agent is minimized.

Typical examples of ultraviolet absorbents which can be used include benzotriazole series compounds, cinnamic acid ester series compounds, aminoallylidene-maron-nitrile series compounds, benzophenone series compounds, etc., which are known in the art, can be used.

The ultraviolet absorbent for use in this invention can be added to a coating composition for a desired layer, in particular, an interlayer as an emulsified dispersion using an oil drop-in-water dispersion method (W/O emulsion method) or a polymer dispersion method.

In the oil drop-in-water dispersion method, the ultraviolet absorbent may be dissolved in a high-boiling organic solvent, which would remain inside microcapsules, having a boiling point of at least 175° C., an auxiliary solvent, which would be evaporated during emulsification, having a boiling point of from 30° C. to 160° C. or the mixture thereof, and then the solution is finely dispersed in water or an aqueous medium such as an aqueous gelatin solution or an aqueous polyvinyl alcohol solution in the presence of a surface active agent.

Examples of appropriate high-boiling organic solvents are described in U.S. Pat. No. 2,322,027. Furthermore, as the high-boiling organic solvent and the auxiliary solvent for use in this case, the solvents described hereinabove for microencapsulation are preferably used. Also, the dispersion of the ultraviolet absorbent may be performed with a phase conversion and, if desired, the emulsified dispersion of the ultraviolet absorbent may be used for coating after removing or decreasing auxiliary solvent using a noodle washing method or an ultrafiltration method.

The steps involved and the effects of a latex dispersion method and examples of the latex for impregnation are described in U.S. Pat. No. 4,199,363, West German Patent Application (OLS) Nos. 2,541,274 and 2,541,230, JP-A No. 49-74538, JP-A No. 51-59943, and JP-A No. 54-32552 (corresponding to U.S. Pat. No. 4,368,258), and *Research Disclosure*, Vol. 148, No. 14850 (August, 1976).

Examples of the suitable latexes are copolymer latexes of acrylic acid esters or methacrylic acid esters (e.g., ethyl acrylate, n-butyl acrylate, n-butyl methacrylate, and 2-acetoacetoxyethyl methacrylate) and acid monomers (e.g., acrylic acid and 2-acrylamido-2-methylpropanesulfonic acid).

Specific ultraviolet absorbents most preferably used in this invention are ultraviolet absorbents having a structure which minimizes diffusion into the adjacent layers and examples of such an ultraviolet absorbent are polymers or latexes copolymerized with an ultraviolet absorbent. Typical examples of these ultraviolet absorbents are described in European Patent No. 127,819, British Patent No. 2,118,315, JP-A No. 59-68731 (corresponding to U.S. Pat. No. 4,551,420), JP-A No. 59-26733 (corresponding to U.S. Pat. No. 4,645,735), JP-A No. 59-23344 (corresponding to U.S. Pat. No. 4,464,462), JP-A No. 58-11942, and JP-A No. 47-560, U.S. Pat. Nos. 4,307,184, 4,202,836, 4,202,834, 4,207,253, and 4,178,303.

Such an ultraviolet absorbent may be incorporated in the interlayer(s) but, if desired, it may be incorporated in the protective layer, the light- and heat-sensitive layers, an antihalation layer, etc.

In this invention, where a protective layer is present, it is preferred for this layer to contain a matting agent. Examples of the matting agent are particles of an inorganic compound such as silica, magnesium oxide, barium sulfate, strontium sulfate, silver halide, etc.; particles of a polymer such as polymethyl methacrylate, polyacrylonitrile, polystyrene, etc.; and particles of a starch such as carboxy starch, corn starch, carboxynitrophenyl starch, etc. The particle sizes of the matting agent are preferably from 1 μm to 20 μm.

Of the above described matting agents, polymethyl methacrylate particles and silica particles particularly preferred. As silica particles, Siloid Al-1, 65, 72, 79, 74, 404, 620, 308, 978, 161, 162, 244, 55, 266, 150, etc., (trade names, made by Fuji-Devison Chemical Ltd.) are preferred.

The amount of the matting agent is preferably from 2 to 500 mg/m$^2$, and particularly preferably from 5 to 100 mg/g$^2$.

In this invention, it is preferred to use a hardening agent for the light- and heat-sensitive layer(s), interlayer(s), protective layer, etc., of the recording material of this invention. It is particularly preferred to use a hardening agent for the protective layer to reduce the tackiness of the protective layer.

Typical examples of hardening agents, for example, include "gelating hardening agents" which are used for the production of photographic light-sensitive material. Examples of hardening agents are aldehdye series compounds such as formaldehyde, glutaraldehyde, etc.; compounds having a reactive halogen described in U.S. Pat. No. 3,635,718; compounds having a reactive ethylene-unsaturated bond described in U.S. Pat. No. 3,635,718, aziridine series compounds described in U.S Pat. No. 3,017,280; epoxy series compounds described in U.S. Pat. No. 3,091,537; halogenocarboxyaldehydes such as mucochloric acid, etc.; dioxanes such as dihydroxydioxane, dichlorodioxane, etc.; vinylsulfons described in U.S. Pat. Nos. 3,642,486 and 3,687,707; vinylsulfone precursors described in U.S. Pat. No. 3,841,872; ketovinyls described in U.S. Pat. No. 3,640,720; and inorganic hardening agents such as chromium alum, zirconium sulfate, boric acid, etc.

Particularly preferred hardening agents are 1,3,5-triacryloyl-hexahydro-s-triazine, 1,2-bisvinylsulfonylmethane, 1,3-bis(vinylsulfonylmethyl)-propanol-2, bis($\alpha$-vinylsulfonylacetamido)ethane, 2,4-di-chloro-6-hydroxy-s-triazine·sodium salt, 2,4,6-triethyleneiminostriazine, and boric acid.

The amount of the hardening agent is preferably from 0.5% to 5% by weight based on the amount of the binder.

Furthermore, the protective layer may contain colloidal silica to reduce the tackiness of the layer. Examples of colloidal silica which can be used in this invention are Snow Tex 20, Snow Tex 30, Snow Tex C, Snow Tex 0, and Snow Tex N (trade names, made by Nissan Chemical Industries, Ltd) The amount is preferably from 5% to 80% by weight based on the amount of the binder.

Also, the protective layer may further contain a fluorescent brightening agent or a blue dye as a bluing agent to increase the whiteness of the recording material of this invention.

In this invention, dispersion of the light-hardenable composition for introducing it into the light- and heat-sensitive layer, dispersion of the electron donative colorless dye, and encapsulation are preferably carried out in an aqueous solution of a water-soluble polymer as a protective colloid. Suitable water-soluble polymers which are preferably used in this invention are polymers which can be dissolved in water at 25° C. in an amount of at least 5% by weight.

Typical examples of water-soluble polymers are proteins such as gelatin, gelatin derivatives, albumin, casein, etc.; cellulose derivatives such as methyl cellulose, carboxymethyl cellulose, etc.; saccharose derivatives such as sodium alginate, starches (including modified starch), etc.; gum arabic; and synthetic polymers such as polyvinyl alcohol, the hydrolyzed products of styrene-maleic anhydride copolymers, carboxy-modified polyvinyl alcohol, polyacrylamide, saponified products of vinyl acetate-polyacrylic acid copolymers, and polystyrenesulfonates. Polyvinyl alcohol and gelatin are preferred as such a polymer.

Examples of suitable binders for the layers of the recording material of this invention, such as the protective layer, the light- and heat-sensitive layer(s), the interlayer(s), etc., include water-soluble polymers described above and solvent-soluble polymers such as polysturene, polyvinyl formal, polyvinyl butyral, acrylic resins (e.g., polymethyl acrylate, polybutyl acrylate, polymethyl methacrylate, polybutyl methacrylate, and copolymers thereof), phenol resins, styrene-butadiene resins, ethyl cellulose, epoxy resins, urethane resins, etc., and latexes of these polymers. Of these polymers, gelatin and polyvinyl alcohol are preferred.

The layers of the light- and heat-sensitive recording material of this invention may further contain various surface active agents for various purposes, for example as a coating aid, for static prevention, for slipping improvement, for improvement in emulsion-dispersibility, for adhesion prevention, etc.

Examples of typical surface active agents which can be used are nonionic surface active agents such as saponin, polyethylene oxide derivatives (e.g., polyethylene oxide and an alkyl ether of polyethylene oxide), etc.; anionic surface active agents such as alkylsulfonates, alkylbenzenesulfonates, alkylnaphthalenesulfonates, alkylsulfuric acid esters, N-acyl-N-alkyltaurines, sulfosuccinic acid esters, sulfoalkylpolyoxyethylenealkyl phenyl ethers, etc.; amphoteric surface active agents such as alkylbetaines, alkylsulfobetaines, etc.; and cationic surface active agents such as aliphatic or aromatic quaternary ammonium salts, etc.

The light- and heat-sensitive recording materials of this invention can further contain, if desired, various additives in addition to the above described additives, such as irradiation or halation preventing dyes, ultraviolet absorbents, plasticizers, fluorescent brightening agents, matting agents coating aids, hardening agents, antistatic agents, slipping improving agents, etc. Typical examples of these additives are described in *Research Disclosure*, Vol. 176, Item 17643 (December 1978) and ibid., Vol. 187, Item 18716 (November 1979).

The light- and heat-sensitive recording material of this invention is produced by dissolving each of the above-described components for the light- and heat-sensitive layer and components for each of the other layers in a solvent and coating the coating compositions on a desired support followed by drying.

Suitable the solvents which can be used for preparing the coating compositions are water, alcohols (e.g., methanol, ethanol, n-propanol, iso-propanol, n-butanol, sec-butanol, methyl cellosolve, and 1-methoxy-2-propanol; halogenated solvents (e.g., methylene chloride and ethylene chloride); ketones such as acetone, cyclohexanone, and methyl ethyl ketone); esters (e.g., methyl acetate cellosolve, ethyl acetate, and methyl acetate}; toluene, and xylene. These solvents may be used alone or as a mixture thereof. Of these solvents, water is particularly preferred.

For coating the coating compositions on a support, a blade coater, a rod coater, a knife coater, a roll doctor coater, a reverse roll coater, a transfer roll coater, a gravure coater, a kiss roll coater, a curtain coater, an extrusion coater, etc., can be used. Coating methods which can be employed in this invention are described in *Research Disclosure*, Vol. 200, Item 20036, XV (December, 1980). The thickness of recording layer is suitably from 0.1 $\mu$m to 50 $\mu$m.

The recording material of this invention can be used in various ways, such as in copiers, facsimiles, printer labels, color proofs, overhead projectors, secondary originals; etc.

Appropriate supports for the recording materials of this invention are papers, resin-coated papers, resin-laminated papers, synthetic papers, transparent films (e.g., polyethylene terephthalate films, cellulose triacetate films, polyethylene films, polystyrene films, and polycarbonate films), sheets of metals (e.g., aluminum, zinc and copper), and above-described paper or plastic supports subjected to a surface treatment, an undercoating, or metal vapor deposition.

The support which can be employed in this invention are also described in *Research Disclosure*, Vol. 200, Item 20036, XVII (December 1980).

Also, if desired, an antihalation layer, etc., may be formed on the surface of the support and also a slipping layer, an antistatic layer, a curling prevention layer, an adhesive layer, etc., may be formed on the back side of the support.

The light- and heat-sensitive recording material of this invention can be used for recording at high sensitivity with light over a wide wavelength region of from ultraviolet light to visible light.

Typical light sources are a mercury lamp, a xenone lamp, a tungsten lamp, a metal halide lamp, an argon laser, a helium neon laser, a semiconductor laser, an LED (light emitting diode), a fluorescent lamp, etc.

Various light exposure methods such as a contact exposure of an original as in a lithographic light-sensitive film, a magnification exposure as in slide projection, a liquid crystal image display, etc., and a reflection exposure utilizing reflected light from an original can be utilized as an image recording method. In multicolor recording, multiple image recordings using light with a different wavelength may be performed. Different wavelengths of light can be obtained by changing a light source or a light filter.

In recording using the light- and heat-sensitive recording material of this invention, a heat development is applied simultaneously with or after the above-described imagewide exposure. Conventionally known methods can be used for heat development. The heating temperature is generally from 80° C. to 200° C., and preferably from 100° C. to 160° C., and the heating time is from 1 second to 5 minutes, and preferably from 3 seconds to 1 minutes.

Furthermore, if desired, the light- and heat-sensitive recording material may be subjected to an overall exposure after heat-development to light-harden the unhardened portions. Since by the overall exposure, the occurrence of the coloring reaction in the background portion and the occurrence of discoloring reaction in the coloring portion are restricted, the storage stability of images formed is improved.

The light- and heat-sensitive recording material of this invention is a mono-sheet type recording material not requiring extra materials and forms clear multicolor images by simple processing comprising an image exposure and a heating operation only. Furthermore, where the interlayer(s) contain an ultraviolet absorbent and/or where the light- and heat-sensitive layer contains a specific photopolymerization initiator in preferred embodiments of this invention, the clarity of each of the color images or the multicolor images is improved by the effects of the present invention. Furthermore, in employing a protective layer in another embodiment of this invention, clear images can be obtained without staining the original and the heating means.

The present invention will be explained in greater detail by reference to the following examples, but the invention should not be construed as being limited thereto.

Unless otherwise indicated all parts percents, ratios and the like are by weighs.

REFERENCE EXAMPLE 1

Production of Ultraviolet Absorbent Latex (1)

In a flask were placed 200 ml of distilled water and 0.5 g a surface active agent (3) and the mixture was stirred at 80° C. in a nitrogen gas stream. Then, 0.5 g of potassium persulfate and 0.25 g of sodium hydrogen sulfite were added to the mixture. Furthermore, a mixture of 16 g of polymerizable ultraviolet absorbent (1) shown below, 33 g of butyl acrylate, and 1 g of acrylic acid was added thereto little by little. After adding the total amount thereof, 0.5 g of potassium persulfate and 0.25 g of sodium hydrogen sulfite were further added to the mixture followed by stirring for one hour. The pH of the solution obtained was adjusted to 6 with an aqueous solution of 1 N sodium hydroxide and then the solution was filtered using filter paper to provide a desired latex.

REFERENCE EXAMPLE 2

Production of Ultraviolet Absorbent Latex (2)

By following the same procedure as in Reference Example 1 except that 5 g of polymerizable ultraviolet absorbent (2) shown below, and 44 g of butyl acrylate were used in place of 16 g of the polymerizable ultraviolet absorbent (1), and 33 g of butyl acrylate, respectively, ultraviolet absorbent latex (2) was obtained.

Polymerizable Ultraviolet Absorbent (1):

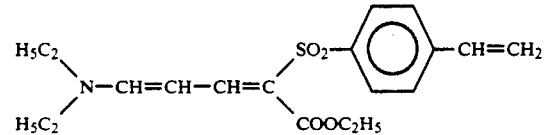

Polymerizable Ultraviolet Absorbent (2):

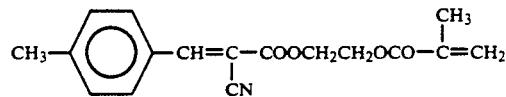

REFERENCE EXAMPLE 3

Production of Ultraviolet Absorbent Latex (7) for Ultraviolet Absorbent

In a flask were placed 400 ml of distilled water and 1 g a surface active agent (3) and the mixture was stirred at 80° C. in a nitrogen gas stream and then 1 g of potassium persulfate and 0.5 g of sodium hydrogensulfite were added thereto. Furthermore, a mixture of 79 g of butyl methacrylate, 20 g of butyl acrylate, and 1 g of acrylic acid was added to the mixture little by little. After adding the total amount thereof, 1 g of potassium persulfate and 0.5 g of sodium hydrogen sulfite were added to the mixture followed by stirring for one hour. The pH of the solution was adjusted to 6 with an aqueous solution of 1 N sodium hydroxide and then the solution was filtered with filter paper to provide a desired latex.

REFERENCE EXAMPLE 4

Production of electron donative colorless dye (1) microcapsules

In 10.4 g of ethyl acetate was dissolved 12.4 g of electron donative colorless dye (1) shown below, and 2.4 of dicyclohexyl phthalate, 27 g of Takenate D-110N (trade name, made by Takeda Chemical Industries, Ltd.), and 3 g of Milionate MR200 (trade name, made by Nippon Polyurethane Kogyo K.K.) were added to the solution. The solution thus obtained was emulsion-dispersed in a mixture of 4.6 g of polyvinyl alcohol and 74 g of water at 20° C. to obtain an emulsion having a mean particle size of 1.5 μm. To the emulsion obtained ws added 100 g of water and the temperature of the mixture was increased to 60° C. with stirring to provide a dispersion of microcapsules containing the electron donative colorless dye (1) as the cores after 2 hours.

REFERENCE EXAMPLE 5

Preparation of electron donative colorless dye (2) microcapsules (a)

By following the same procedure as in Reference Example 4 except that electron donative colorless dye (2) shown below was used in place of the electron donative colorless dye (1), a dispersion of microcapsules (a) containing electron donative colorless dye (2) was obtained.

REFERENCE EXAMPLE 6

Preparation of electron donative colorless dye (3) microcapsules

By following the same procedure as in Reference Example 4 except that electron donative colorless dye (3) was used in place of electron donative colorless dye (1), a dispersion of microcapsules containing the electron donative colorless dye (3) was obtained.

REFERENCE EXAMPLE 7

Preparation of electron donative colorless dye (4) microcapsules

In 10.4 g of ethyl acetate was dissolved 12.4 g of electron donative colorless dye (4) shown below, and 12.4 of dicyclohexyl phthalate, 27 g of Takenate D-110N and 3 g of Milionate MR200 were added to the solution. The solution thus obtained was emulsion-dispersed in a mixture of 4.6 g of polyvinyl alcohol and 74 g of water at 20° C. to prepare an emulsion having a mean particle size of 2.5 μm. To the emulsion obtained was added 100 g of water and the temperature of the mixture was increased to 60° C. with stirring to provide a dispersion of microcapsules containing electron donative colorless dye (4) as the cores after 2 hours.

REFERENCE EXAMPLE 8

Preparation of electron donative colorless dye (2) microcapsules (b)

By following the same procedure as in Reference Example 7 except that electron donative colorless dye (2) shown below was used in place of the electron donative colorless dye (4), a dispersion of microcapsules (b) containing the electron donative colorless dye (2) was obtained.

REFERENCE EXAMPLE 9

Preparation of electron donative colorless dye (5) microcapsules

By following the same procedure as in Reference Example 7 except that electron donative colorless dye (5) was used in place of the electron donative colorless dye (4), a dispersion of microcapsules containing electron donative colorless dye (5) was obtained.

Electron Donative Colorless Dye (1):

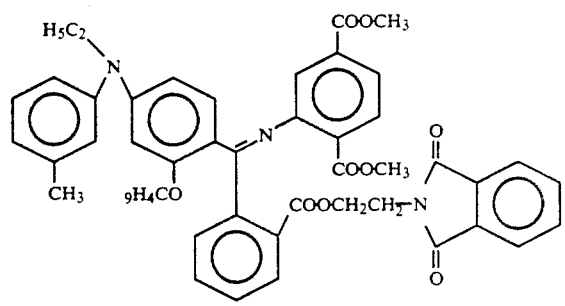

Electron Donative Colorless Dye (2):

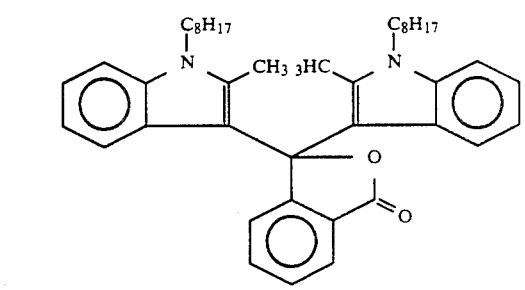

Electron Donative Colorless Dye (3):

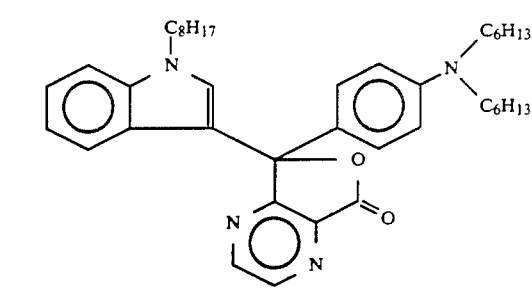

Electron Donative Colorless Dye (4):

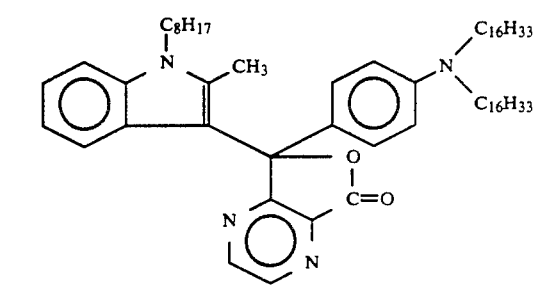

Electron Donative Colorless Dye (5):

-continued

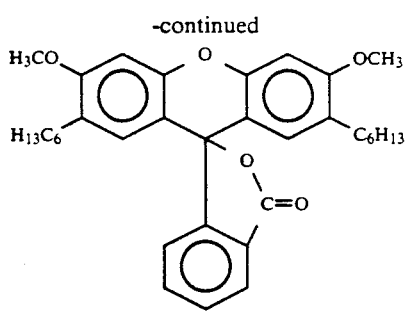

REFERENCE EXAMPLE 10

Preparation of emulsion of light-hardenable composition (1)

To a solution 4 g of ethyl acetate containing 0.2 g of photopolymerization initiator (1) shown below, 0.2 g of spectral sensitizing dye (1) shown below, and 0.2 g of N-phenylglycine ethyl ester as an assistant for accelerating polymerization were added 10 g of electron acceptive compound (1) shown below and 8 g of trimethylolpropane triacrylate (trifunctional acrylate, molecular weight of about 296). The solution thus formed was added to a mixture of 19.2 g of an aqueous solution of 15% polyvinyl alcohol, 4.8 g of water, 0.8 g of an aqueous solution of 2% surface active agent (1) shown below, and 0.8 g of an aqueous solution of 2% surface active agent (2) shown below and the mixture was emulsified using a homogenizer (manufactured by Nippon Seiki K.K.) at 10,000 r.p.m. for 5 minutes to provide an emulsion of light-hardenable composition (1).

REFERENCE EXAMPLE 11

Preparation of emulsion of light-hardenable composition (2)

By following the same procedure as in Reference Example 10 except that 0.2 g of photopolymerization initiator (2) shown below was used in place of 0.2 g of photopolymerization initiator (1) and 0.2 g of spectral sensitizing dye (1), an emulsion of light-hardenable composition (2) was obtained.

REFERENCE EXAMPLE 12

Preparation of emulsion of light-hardenable composition (3)

By following the same procedure as in Reference Example 10 except that 0.2 g of photopolymerization initiator (3) shown below was used in place of 0.2 g of photopolymerization initiator (1) and 0.2 g of spectral sensitizing dye (1), an emulsion of light-hardenable composition (3) was obtained.

REFERENCE EXAMPLE 13

Preparation of emulsion of light-hardenable composition (4)

By following the same procedure as in Reference Example 10 except that 0.2 g of photopolymerization initiator (1), 0.2 g of spectral sensitizing dye (1), and 0.2 g of ultraviolet absorbent (1) shown below were used in place of 0.2 g of photopolymerization initiator (1) and 0.2 g of spectral sensitizing dye (1), an emulsion of light-hardenable composition (4) was obtained.

REFERENCE EXAMPLE 14

Preparation of emulsion of light-hardenable composition (5)

By following the same procedure as in Reference Example 10 except that 0.2 g of photopolymerization initiator (2) and 0.2 g of ultraviolet absorbent (2) shown below were used in place of 0.2 g of photopolymerization initiator (1) and 0.2 g of spectral sensitizing dye (1), an emulsion of light-hardenable composition (5) was obtained.

REFERENCE EXAMPLE 15

Preparation of emulsion of light-hardenable composition (6)

By following the same procedure as in Reference Example 10 except that 0.2 g of photopolymerization initiator (2) was used in place of 0.2 g of photopolymerization initiator (1) and 0.2 g of spectral sensitizing dye (1), and further monomer (1) shown below was used in place the acrylate monomer, an emulsion of light-hardenable composition (6) was obtained.

REFERENCE EXAMPLE 16

Preparation of emulsion of light-hardenable composition (7)

By following the same procedure as in Reference Example 10 except that 0.2 g of photopolymerization initiator (2) was used in place of 0.2 g of photopolymerization initiator (1) and 0.2 g of spectral sensitizing dye (1), and further monomer (2) shown below was used in place of the acrylate monomer, an emulsion of light-hardenable composition (7) was obtained.

REFERENCE EXAMPLE 17

Preparation of emulsion of light-hardenable composition (8)

By following the same procedure as in Reference Example 10 except that 0.2 g of photopolymerization initiator (2) was used in place of 0.2 g of photopolymerization initiator (1) and 0.2 g of spectral sensitizing dye (1), and further monomer (3) shown below was used in place of the acrylate monomer, an emulsion of light-hardenable composition (8) was obtained.

REFERENCE EXAMPLE 18

Preparation of emulsion of light-hardenable composition (9)

To a solution 3 g of ethyl acetate containing 0.05 g of photopolymerization initiator (1) shown below, 0.05 g of spectral sensitizing dye (2) shown below, and 0.2 g of N-phenylglycine ethyl ester as an assistant for accelerating polymerization was added 8 g of electron acceptive compound (2) shown below. The solution thus formed was added to a mixture of 9.6 g of an aqueous solution of 7.5% polyvinyl alcohol, 0.8 g of an aqueous solution of 2% surface active agent (1) shown below, and 0.8 g of an aqueous solution of 2% surface active agent (2) shown below and the mixture was emulsified using a homogenizer (manufactured by Nippon Seiki K.K.) at 10,000 r.p.m. for 5 minutes to provide an emulsion of light-hardenable composition (9).

REFERENCE EXAMPLE 19

Preparation of emulsion of light-hardenable composition (10)

By following the same procedure as in Reference Example 18 except that 0.8 g of photopolymerization initiator (4) shown below was used in place of 0.05 g of photopolymerization initiator (1) and 0.05 g of spectral sensitizing dye (2), an emulsion of light-hardenable composition (10) was obtained.

REFERENCE EXAMPLE 20

Preparation of emulsion of light-hardenable composition (11)

By following the same procedure as in Reference Example 218 except that 0.2 g of photopolymerization initiator (3) shown below was used in place of 0.05 g of photopolymerization initiator (1) and 0.05 g of spectral sensitizing dye (2), an emulsion of light-hardenable composition (11) was obtained.

REFERENCE EXAMPLE 21

Preparation of emulsion of light-hardenable composition (12)

By following the same procedure as in Reference Example 18 except that 0.05 g of photopolymerization initiator (1), 0.05 g of spectral sensitizing dye (2), and 0.2 g of ultraviolet absorbent (3) shown below were used in place of 0.05 g of photopolymerization initiator (1) and 0.05 g of spectral sensitizing dye (2), an emulsion of light-hardenable composition (12) was obtained.

REFERENCE EXAMPLE 22

Preparation of emulsion of light-hardenable composition (13)

By following the same procedure as in Reference Example 18 except that 0.8 g of photopolymerization initiator (4) and 0.2 g of ultraviolet absorbent (4) shown below were used in place of 0.05 g of photopolymerization initiator (1) and 0.05 g of spectral sensitizing dye (2), an emulsion of light-hardenable composition (13) was obtained.

REFERENCE EXAMPLE 23

Preparation of emulsion of light-hardenable composition (14)

To a solution 4 g of methylenechloride containing composition (14) shown in Table 1 below, and 0.2 g of N-phenylglycine ethyl ester as an assistant for accelerating polymerization was added 8 g of electron acceptive compound (2) shown below. The solution thus formed was added to a mixture of 9.6 g of an aqueous solution of 7.5% polyvinyl alcohol, 0.8 g of an aqueous solution of 2% surface active agent (1) shown below, and 0.8 g of an aqueous solution of 2% surface active agent (2) shown below and the mixture was emulsified using a homogenizer (manufactured by Nippon Seiki K.K.) at 10,000 r.p.m. for 5 minutes to provide an emulsion of light-hardenable composition (14).

REFERENCE EXAMPLE 24 TO 30

Preparation of emulsion of light-hardenable composition (15) to (21)

By following the same procedure as in Reference Example 23 except that compositions (15) to (21) were respectively used in place of composition (14), an emulsion of light-hardenable composition (15) to (21) were obtained.

TABLE 1

|  | Polymerization Initiator ||||| | Spectral Sensitizer | Ultraviolet Absorbent ||
|---|---|---|---|---|---|---|---|---|---|
|  | (5) | (6) | (7) | (2) | (8) | (1) | (1) | (2) | (4) |
| For Short Wave |  |  |  |  |  |  |  |  |  |
| Composition (14) (the present invention) | 0.1 | — | — | — | — | — | — | — | — |
| Composition (15) (the present invention) | — | 0.1 | — | — | — | — | — | — | — |
| Composition (16) (Com. Ex.) | — | — | 0.1 | — | — | — | — | — | — |
| For Medium Wave |  |  |  |  |  |  |  |  |  |
| Composition (17) (the present invention) | — | — | — | 0.1 | — | — | — | 0.4 | — |
| Composition (18) (the present invention) | — | — | — | 0.1 | — | — | — | — | — |
| Composition (19) (Com. Ex.) | — | — | — | — | 0.1 | — | — | 0.4 | — |
| For Long Wave |  |  |  |  |  |  |  |  |  |
| Composition (20) | — | — | — | — | — | 0.1 | 0.05 | — | 0.2 |
| Composition (21) | — | — | — | — | — | 0.1 | 0.05 | — | — |

The compounds used in the above reference examples are shown below.

Photopolymerization Initiator (1):

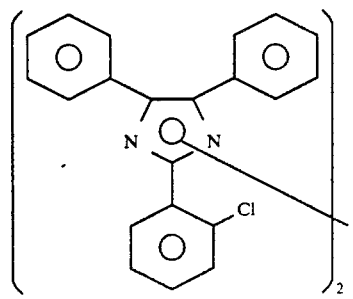

Photopolymerization Initiator (2):

[Structure: 4-methoxyphenyl-bis(trichloromethyl)triazine]

Photopolymerization Initiator (3):

[Structure: diphenyl-N-OCH₃·BF₄ salt]

Photopolymerization Initiator (4):

2,2-Dimethoxy-1,2-diphenylethane-1-one

Photopolymerization Initiator (5):

[Structure: 4-chlorophenyl-bis(trichloromethyl)triazine]

Photopolymerization Initiator (6):

[Structure: diphenyl-N-OCH₃·PF₆ salt]

Photopolymerization Initiator (7):

[Structure: 4-methylphenyl-C(=O)-CH(OH)-4-methoxyphenyl]

Photopolymerization Initiator (8):

[Structure: benzothiazol-2-yl-C(=O)-3,4-dimethoxyphenyl]

Spectral Sensitizing Dye (1):

[Structure: thioxanthone with two C₂H₅ groups]

Spectral Sensitizing Dye (2):

7-Diethylamino-4-methyl-coumarin

Electron Acceptive Compound (1):

[Structure: 2,4-dihydroxy-benzoate-COOCH(CH₃)CH₂O-phenyl]

Electron Acceptive Compound (2):

Hydroxyethyl-acrylate monophthalate

Surfacte Active Agent (1):

$H_{19}C_9$—〇—$O(CH_2)_4$—$SO_3Na$

Surface Active Agent (2):

$C_{12}H_{25}SO_3Na$

Surfacte Active Agent (3):

$H_{19}C_9$—〇—$O(CH_2CH_2O)_3(CH_2)_4SO_3Na$

Monomer (1):
(Polyfunctional acrylamide monomer, molecular weight about 211)

$CH_2$=$CH$—$CONHCH_2CH_2NHCH_2CH_2NHCO$—$CH$=$CH_2$

Monomer (2):
(Monofunctional acrylate monomer, molecular weight about 218)

[Structure: H₃CH₂C-C(CH₃)₂-phenyl-OCO-CH=CH₂]

Monomer (3):
(Monofunctional acrylamide monomer, molecular weight about 217)

$C_5H_{11}$—〇—$NHCO$—$CH$=$CH_2$

REFERENCE EXAMPLE 31

Preparation of the emulsion of ultraviolet absorbent (1)

A solution of 0.26 9 of the ultraviolet absorbent (1) shown below dissolved in a mixture of 3 9 of ethyl acetate and 5 9 of dibutyl phthalate was added to a mixture of 9.6 9 of an aqueous solution of 7.5% polyvinyl alcohol, 0.8 g of an aqueous solution of 2% surface active agent (1) shown above, and 0.8 g of an aqueous solution of 2% surface active agent (2) shown above and the mixture was emulsified for 5 minutes using a homogenizer (manufactured by Nippon Seiki K.K.) at 10,000 r.p.m. to provide an emulsion of ultraviolet absorbent (1).

REFERENCE EXAMPLE 32

Preparation of the emulsion of ultraviolet absorbent (2)

A solution of 0.26 g of the ultraviolet absorbent (2) shown below dissolved in a mixture of 3 g of ethyl acetate and 5 g of dibutyl phthalate was added to a mixture of 9.6 g of an aqueous solution of 7.5% polyvinyl alcohol, 0.8 g of an aqueous solution of 2% surface active agent shown above, and 0.8 g of an aqueous solution of 2% surface active agent (2) shown above and they were emulsified for 5 minutes using a homogenizer (manufactured by Nippon Seiki K.K.), at 10,000 r.p.m. to provide an emulsion of ultraviolet absorbent (2).

REFERENCE EXAMPLE 33

Preparation of the emulsion of ultraviolet absorbent (3)

A solution of 0.26 g of the ultraviolet absorbent (3) shown below dissolved in a mixture of 3 g of ethyl acetate and 5 g of dibutyl phthalate was added to a mixture of 9.6 g of an aqueous solution of 7.5% polyvinyl alcohol, 0.8 g of an aqueous solution of 2% surface active agent (1) shown above, and 0.8 g of an aqueous solution of 2% surface active agent (2) shown above and the mixture was emulsified for 5 minutes using a homogenizer (manufactured by Nippon Seiki K.K.), at 10,000 r.p.m. to provide an emulsion of ultraviolet absorbent (3).

REFERENCE EXAMPLE 34

Preparation of the emulsion of ultraviolet absorbent (4)

A solution of 0.26 g of the ultraviolet absorbent (4) shown below dissolved in a mixture of 3 g of ethyl acetate and 5 g of dibutyl phthalate was added to a mixture of 9.6 g of an aqueous solution of 7.5% polyvinyl alcohol, 0.8 g of an aqueous solution of 2% surface active agent (1) shown above, and 0.8 9 of an aqueous solution of 2% surface active agent (2) shown above and they were emulsified for 5 minutes using a homogenizer (manufactured by Nippon Seiki K.K.), at 10,000 r.p.m. to provide an emulsion of ultraviolet absorbent (4).

REFERENCE EXAMPLE 35

Preparation of the latex dispersion of ultraviolet absorbent (1)

A solution of 0.26 g of the ultraviolet absorbent (1) shown below dissolved in 3 g of ethyl acetate was added to a mixture of 9.6 g of an aqueous solution of 7.5% polyvinyl alcohol, 0.8 g of an aqueous solution of 2% surface active agent (1), and 0.8 g of an aqueous solution of 2% surface active agent (2) and they were emulsified for 5 minutes using a homogenizer (manufactured by Nippon Seiki K.K.), at 10,000 r.p.m. The emulsion thus prepared was mixed with 9.25 g of the latex dispersion latex (1) described above and 25.5 g of an aqueous solution of 5% polyvinyl alcohol with stirring to provide a latex dispersion of the ultraviolet absorbent (1).

REFERENCE EXAMPLE 36

Preparation of the latent dispersion of ultraviolet absorbent (2)

A solution of 0.26 g of the ultraviolet absorbent (2) shown below dissolved in 3 g of ethyl acetate was added to a mixture of 9.6 g of an aqueous solution of 7.5% polyvinyl alcohol, 0.8 g of an aqueous solution of 2% surface active agent (1), and 0.8 g of an aqueous solution of 2% surface active agent (2) and they were emulsified for 5 minutes using a homogenizer (manufactured by Nippon Seiki K.K.), at 10,000 r.p.m. The emulsion thus formed was mixed with 9.25 g of the latex dispersion latex (1) described above and 25.5 g of an aqueous solution of 5% polyvinyl alcohol to provide a latex dispersion of ultraviolet absorbent (2).

REFERENCE EXAMPLE 37

Preparation of the latex dispersion of ultraviolet absorbent (3)

A solution of 0.26 g of the ultraviolet absorbent (3) shown below dissolved in 3 g of ethyl acetate was added to a mixture of 9.6 g of an aqueous solution of 7.5% polyvinyl alcohol, 0.8 g of an aqueous solution of 2% surface active agent (1), and 0.8 g of an aqueous solution of 2% surface active agent (2) and they were emulsified for 5 minutes using a homogenizer (manufactured by Nippon Seiko K.K.), at 10,000 r.p.m. The emulsion thus prepared was mixed with 9.25 g of the latex dispersion latex (2) described above and 25.5 g of an aqueous solution of 5% polyvinyl alcohol with stirring to provide a latex dispersion of the ultraviolet absorbent (3).

Ultraviolet Absorbent (1):

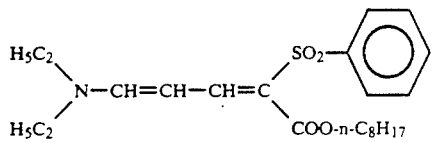

Ultraviolet Absorbent (2):

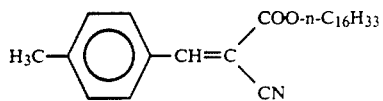

Ultraviolet Absorbent (3):

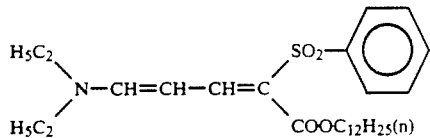

Ultraviolet Absorbent (4):

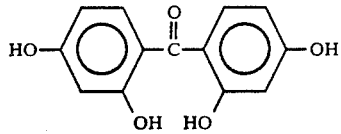

REFERENCE EXAMPLE 38

Preparation of the coating composition for light- and heat-sensitive layer (1)

By mixing 1 g of the microcapsules containing electron donative colorless dye (1) described above and 10 g of the emulsion of light-hardenable composition (1) described above, a coating composition for light- and heat-sensitive layer (1) was prepared.

REFERENCE EXAMPLE 39

Preparation of the coating composition for light- and heat-sensitive layer (2)

By mixing 1 g of the microcapsules (a) containing electron donative colorless dye (2) described above and 10 g of the emulsion of light-hardenable composition (2) described above, a coating composition for light- and heat-sensitive layer (2) was prepared.

REFERENCE EXAMPLE 40

Preparation of the coating composition for light- and heat-sensitive layer (3)

By mixing 1 g of the microcapsules containing electron donative colorless dye (3) described above and 10 g of the emulsion of light-hardenable composition (3) described above, a coating composition for light- and heat-sensitive layer (3) was prepared.

REFERENCE EXAMPLE 41

Preparation of the coating composition for light- and heat-sensitive layer (4)

By mixing 1 g of the microcapsules containing electron donative colorless dye (1) described above and 10 g of the emulsion of light-hardenable composition (4) described above, a coating composition for light- and heat-sensitive layer (4) was prepared.

REFERENCE EXAMPLE 42

Preparation of the coating composition for light- and heat-sensitive layer (5)

By mixing 1 g of the microcapsules (a) containing electron donative colorless dye (2) described above and 10 g of the emulsion of light-hardenable composition (5) described above, a coating composition for light- and heat-sensitive layer (5) was prepared.

REFERENCE EXAMPLE 43

Preparation of the coating composition for light- and heat-sensitive layer (6)

By mixing 1 g of the microcapsules (a) containing electron donative colorless dye (2) described above and 10 g of the emulsion of light-hardenable composition (6) described above, a coating composition for light- and heat-sensitive layer (6) was prepared.

REFERENCE EXAMPLE 44

Preparation of the coating composition for light- and heat-sensitive layer (7)

By mixing 1 g cf the microcapsules (a) containing electron donative colorless dye (2) described above and 10 g of the emulsion of light-hardenable composition (7) described above, a coating composition for light- and heat-sensitive layer (7) was prepared.

REFERENCE EXAMPLE 45

Preparation of the coating composition for light- and heat-sensitive layer (8)

By mixing 1 g of the microcapsules (a) containing electron donative colorless dye (2) described above and 10 g of the emulsion of light-hardenable composition (8) described above, a coating composition for light- and heat-sensitive layer (8) was prepared.

REFERENCE EXAMPLE 46

Preparation of the coating composition for light- and heat-sensitive layer (9)

By mixing 4 g of the microcapsules containing electron donative colorless dye (4) described above, 12 g of the emulsion of light-hardenable composition (9) described above and 12 g of an aqueous solution of 15% polyvinyl alcohol, a coating composition for light- and heat-sensitive layer (9) was prepared.

REFERENCE EXAMPLE 47

Preparation of the coating composition for light- and heat-sensitive layer (10)

By mixing 4 g of the microcapsules (b) containing electron donative colorless dye (2) described above, and 12 g of the emulsion of light-hardenable composition (10) described above and 12 g of an aqueous solution of 15% polyvinyl alcohol, a coating composition for light- and heat-sensitive layer (10) was prepared.

REFERENCE EXAMPLE 48

Preparation of the coating composition for light- and heat-sensitive layer (11)

By mixing 4 g of the microcapsules containing electron donative colorless dye (5) described above, 12 g of the emulsion of light-hardenable composition (11) described above and 12 g of an aqueous solution of 15% polyvinyl alcohol, a coating composition for light- and heat-sensitive layer (11) was prepared.

REFERENCE EXAMPLE 49

Preparation of the coating composition for light- and heat-sensitive layer (12)

By mixing 4 g of the microcapsules containing electron donative colorless dye (4) described above, 12 g of the emulsion of light-hardenable composition (12) described above and 12 g of an aqueous solution of 15% polyvinyl alcohol, a coating composition for light- and heat-sensitive layer (12) was prepared.

REFERENCE EXAMPLE 50

Preparation of the coating composition for light- and heat-sensitive layer (13)

By mixing 4 g of the microcapsules (b) containing electron donative colorless dye (2) described above, and lo g of the emulsion of light-hardenable composition (13) described above and 12 g of an aqueous solution of 15% polyvinyl alcohol, a coating composition for light- and heat-sensitive layer (13) was prepared.

REFERENCE EXAMPLE 51

Preparation of the coating composition for light- and heat-sensitive layer (14)

By mixing 4 g of the microcapsules containing electron donative colorless dye (4) described above, 12 g of the emulsion of light-hardenable composition (14) described above and 12 g of an aqueous solution of 15% polyvinyl alcohol, a coating composition for light- and heat-sensitive layer (14) was prepared.

REFERENCE EXAMPLES 52 AND 53

Preparation of the coating compositions for light- and heat-sensitive layer (15) and (16)

By following the same procedure as in Reference Example 51 except that the light-hardenable compositions (15) and (16) were used in place of the light-hardenable composition (14), coating compositions for light- and heat-sensitive layer (15) and (16) were obtained.

REFERENCE EXAMPLE 54

Preparation of the coating composition for light- and heat-sensitive layer (17)

By mixing 4 g of the microcapsules containing electron donative colorless dye (5) described above, 12 g of the emulsion of light-hardenable composition (17) described above and 12 g of an aqueous solution of 15% polyvinyl alcohol, a coating composition for light- and heat-sensitive layer (17) was prepared.

REFERENCE EXAMPLES 55 AND 56

Preparation of the coating compositions for light- and heat-sensitive layer (18) and (19)

By following the same procedure as in Reference Example 54 except that the light-hardenable compositions (18) and (19) were used in place of the light-hardenable composition (17), coating compositions for light- and heat-sensitive layer (18) and (19) were obtained.

REFERENCE EXAMPLE 57

Preparation of the coating composition for light- and heat-sensitive layer (20)

By mixing 4 g of the microcapsules containing electron donative colorless dye (5) described above, 12 g of the emulsion of light-hardenable composition (20) described above and 12 g of an aqueous solution of 15% polyvinyl alcohol, a coating composition for light- and heat-sensitive layer (20) was prepared.

REFERENCE EXAMPLE 58

Preparation of the coating composition for light- and heat-sensitive layer (21)

By following the same procedure as Reference Example 57 except that the light-hardenable composition (21) was used in place of the light-hardenable composition (20), a coating composition for light- and heat-sensitive layer (21) was obtained.

REFERENCE EXAMPLE 59

Preparation of the coating composition for interlayer (1)

By mixing 4 g of an aqueous solution of 15% polyvinyl alcohol, 3 g of distilled water, 0.5 g of an aqueous solution of 2% surface active agent (3) shown above, and 3 g of the emulsion of ultraviolet absorbent (1) described above, a coating composition for interlayer (1) was prepared.

REFERENCE EXAMPLE 60

Preparation of the coating composition for interlayer (2)

By mixing 4 g of an aqueous solution of 15% polyvinyl alcohol, 3 g of distilled water, 0.5 g of an aqueous solution of 2% surface active agent (3) shown above, and 3 g of the emulsion of ultraviolet absorbent (2) described above, a coating composition for interlayer (2) was prepared.

REFERENCE EXAMPLE 61

Preparation of the coating composition for interlayer (3)

By mixing 4 g of an aqueous solution of 15% polyvinyl alcohol, 3 g of distilled water, 0.5 g of an aqueous solution of 2% surface active agent (3) shown above, and 4 g of the latex dispersion of ultraviolet absorbent (3) described above, a coating composition for interlayer (3) was prepared.

REFERENCE EXAMPLE 62

Preparation of the coating composition for interlayer (4)

By mixing 4 g of an aqueous solution of 15% polyvinyl alcohol, 3 g of distilled water, 0.5 g of an aqueous solution of 2% surface active agent (3) shown above, and 4 g of the latex dispersion of ultraviolet absorbent (2) described above, a coating composition for interlayer (4) was prepared.

REFERENCE EXAMPLE 63

Preparation of the coating composition for interlayer (5)

By mixing 4 g of an aqueous solution of 15% polyvinyl alcohol, 3 g of distilled water, 0.5 g of an aqueous solution of 2% surface active agent (3) shown above, and 3 g of ultraviolet absorbent latex (1) described above, a coating composition for interlayer (5) was prepared.

REFERENCE EXAMPLE 64

Preparation of the coating composition for interlayer (6)

By mixing 4 g of an aqueous solution of 15% polyvinyl alcohol, 3 g of distilled water, 0.5 g of an aqueous solution of 2% surface active agent (3) shown above, and 4 g of ultraviolet absorbent latex (2) described above, a coating composition for interlayer (6) was prepared.

REFERENCE EXAMPLE 65

Preparation of the coating composition for interlayer (7)

By mixing 4 g of an aqueous solution of 15% polyvinyl alcohol, 3 g of distilled water, and 0.5 g of 2% surface active agent (3) shown below, a coating composition for interlayer (7) was prepared.

REFERENCE EXAMPLE 66

Preparation of the coating composition for interlayer (8)

By mixing 4 g of an aqueous solution of 15% polyvinyl alcohol, 3 g of distilled water, 0.5 g of an aqueous solution of 2% surface active agent (3) shown above, and 3 g of the emulsion of ultraviolet absorbent (3) described above, a coating composition for interlayer (8) was prepared.

REFERENCE EXAMPLE 67

Preparation of the coating composition for interlayer (9)

By mixing 4 g of an aqueous solution of 15% polyvinyl alcohol, 3 g of distilled water, 0.5 g of an aqueous solution of 2% surface active agent (3) shown above, and 4 g of the latex dispersion of ultraviolet absorbent (3) described above, a coating composition for interlayer (9) was prepared.

REFERENCE EXAMPLE 68

Preparation of the coating composition for interlayer (10)

By mixing 4 g of an aqueous solution of 15% polyvinyl alcohol, 3 g of distilled water, 0.5 g of an aqueous solution of 2% surface active agent (3) shown above, and 3 g of the emulsion of ultraviolet absorbent (5) described above, a coating composition for interlayer (10) was prepared.

REFERENCE EXAMPLE 69

Preparation of the coating composition for interlayer (11)

By mixing 4 g of an aqueous solution of 15% polyvinyl alcohol, 3 g of distilled water, 1.0 g of an aqueous solution of 2% surface active agent (3) shown above, and 3 g of ultraviolet absorbent latex (1) described above, a coating composition for interlayer (11) was prepared.

REFERENCE EXAMPLE 70

Preparation of the coating composition for interlayer (12)

By mixing 4 g of an aqueous solution of 15% polyvinyl alcohol, 3 g of distilled water, 1.0 g of 2% surface active agent (3) shown above, and the ultraviolet absorbent latex (2) above, a coating composition for interlayer (12) was prepared.

REFERENCE EXAMPLE 71

Preparation of coating composition for protective layer (1)

By mixing 4.5 g of an aqueous 10% gelatin solution, 1.5 g of distilled water, 0.5 g of an aqueous solution of 2% surface active agent (3) shown above, 1.5 g of an aqueous solution of 1% 2,4-dichloro-6-hydroxy-s-triazine-sodium salt, 50 mg/m2 (as a coating amount) of Siloid 72 (silica particles, trade name, made by Fuji-Devision chemical Ltd.), and 1 g of Snow Tex N (colloidal silica, trade name, made by Nissan Chemical Industries, Ltd.), a coating composition for protective layer (1) was prepared.

REFERENCE EXAMPLE 72

Preparation of coating composition for protective layer (2)

By mixing 4.5 g of an aqueous solution of 10% gelatin, 15 g of distilled water, 1.0 g of an aqueous solution of 2% surface active agent (3) shown above, a coating composition for protective layer (2) was prepared.

REFERENCE EXAMPLE 73

Preparation of coating composition for protective layer (3)

By mixing 4.5 g of an aqueous solution of 10% gelatin, 15 g of distilled water, 1.0 g of an aqueous solution of 2% surface active agent (3) shown above, and 1.5 g of an aqueous solution of 1% 2,4-dichloro-6-hydroxy-s-triazine-sodium salt, a coating composition for protective layer (3) was prepared.

REFERENCE EXAMPLE 74

Preparation of coating composition for protective layer (4)

By mixing 4.5 g of an aqueous solution of 10% gelatin, 15 g of distilled water, 1.0 g of an aqueous solution of 2% surface active agent (3) shown above, and 50 mg/m2 (as a coating amount) of Siloid 72, a coating composition for protective layer (4) was prepared.

REFERENCE EXAMPLE 75

Preparation of coating composition for protective layer (5)

By mixing 3 g of an aqueous solution of 15% polyvinyl alcohol, 3 g of distilled water, 1.0 g of an aqueous solution of 2% surface active agent (3) shown above, and 2 g of Snow Tex N, a coating composition for protective layer (5) was prepared.

REFERENCE EXAMPLE 76

Preparation of coating composition for protective layer (6)

By mixing 3 g of an aqueous solution of 15% polyvinyl alcohol, 3 g of distilled water, and 1.0 g of 2% surface active agent (3) shown above, a coating composition for protective layer (6) was prepared.

EXAMPLES 1 TO 4

The coating composition for light- and heat-sensitive layer (2) prepared above was coated on a polyethylene terephthalate film of 100 μm a thickness of using a coating bar at a dry weight of 8 g/m$^2$ and dried for 10 minutes at 30° C. Then, the coating composition for protective layer (1) prepared above was coated on this layer using a coating bat at a dry weight of 5 g/m$^2$ and dried for 10 minutes at 30° C. to provide a sample of Example 1.

By following the same procedure as in Example 1 using the coating composition for light- and heat-sensitive layer (6) prepared as described above, a sample for Example 2 was obtained.

By following the same procedure as in Example 1 using the coating composition for light- and heat-sensitive layer (7) prepared as described above, a sample for Example 3 was obtained.

By following the same procedure as in Example 1 using the coating composition for light- and heat-sensitive layer (8) prepared as described above, a sample for Example 4 was obtained.

Each of the light- and heat-sensitive recording materials obtained was exposed through a step wedge (Fuji control Wedge, trade name, made by Fuji Photo Film Co., Ltd.) to ultraviolet light from a 1000 watt high-pressure mercury lamp (Jet Light, made by Oak Co.) and thereafter, was heated for 5 seconds with a hot plate at 120° C., whereby a clear magenta negative image was obtained in each sample.

In this case, however, the contrast of the images of the samples of Examples 3 and 4 was higher than those of the samples in Examples 1 and 2, and the sensitivity of the former samples was about 4 times higher than that of the latter samples.

As is clear from the above results, it can be seen that for obtaining clear negative images, the use of a polyfunctional monomer having at least one ester bond and/or amide bond in the molecule and having a molecular weight of at least 200 as the polymerizable monomer for the light- and heat-sensitive layer is superior.

COMPARISON EXAMPLE 1

The coating composition for light- and heat-sensitive layer (1) prepared as described above was coated on a polyethylene terephthalate film of a thickness of 100 μm using a coating bar at a dry weight of 8 g/m² and dried for 10 minutes at 30° C. Then, the coating composition for interlayer (7) prepared as described above was coated on the layer at a dry weight of 5 g/m² and dried. The coating composition for light- and heat-sensitive layer (2) prepared as described above was then coated on the interlayer at a dry weight of 8 g/m² and dried. Then, the coating composition for light- and heat-sensitive layer (7) as described above was coated on this layer at a dry weight of 5 g/m² and dried. The coating composition for light- and heat-sensitive layer (3) prepared as described above then was coated on the layer at a dry weight of 8 g/m² and dried. Furthermore, the coating composition for protective layer (1) prepared as described above was coated thereon using a coating bar at a dry weight of 5 g/m² and dried for 10 minutes at 30° C. to provide a sample for Comparison Example 1.

The light- and heat-sensitive recording material thus obtained was first exposed through a lithographic film having developed images for yellow and an optical filter cutting light of wavelengths of 410 nm. and shorter (SC-41 Filter, trade name, made by Fuji Photo Film Co., Ltd.) to ultraviolet light from a 1000 watt high-pressure mercury lamp (Jet Light, made by Oak Co.). Then, the recording material was exposed through a lithographic film having developed images for magenta and an optical filter transmitting light of wavelength of about 360 nm only (BPB-36 Filter, trade name, made by Fuji Photo Film Co., Ltd.) to light from a high-pressure mercury lamp, and further exposed through a lithographic film having developed images for cyan and an optical filter transmitting light of wavelength of about 300 nm only (BPB-30 Filter, trade name, made by Fuji Photo Film Co., Ltd.) to light from a high-pressure mercury lamp to provide latent images. Thereafter, the recording material was heated for 5 seconds at 110° C. but full color images were not obtained and images mainly composed of yellow images were obtained.

COMPARISON EXAMPLE 2

The coating composition for light- and heat-sensitive layer (4) prepared as described above was coated on a polyethylene terephthalate film of a thickness of 100 μm with a coating bar at a dry weight of 8 g/m² and dried for 10 minutes at 30° C. Then, the coating composition for interlayer (7) as described above was coated on the layer at a dry weight of 5 g/m² and dried. The coating composition for light- and heat-sensitive layer (5) was then coated on the layer at a dry weight of 8 g/m² and dried. Then, the coating composition for interlayer (7) described above was coated on the layer at a dry weight of 5 g/m² and dried. The coating composition for light- and heat-sensitive layer (3) prepared as described above was then coated on the layer at a dry weight of 8 g/m² and dried. Furthermore, the coating composition for protective layer (1) as described above was coated thereon with a coating bar at a dry weight of 5 g/m² and dried for 10 minutes at 30° C. to provide a sample for Comparison Example 2.

The light- and heat-sensitive recording material obtained was exposed and heat-developed in the same manner as in Comparison Example 1 and obscure full color images having low colored density were obtained.

EXAMPLE 5

By following the same procedure as in the case of preparing the sample of Comparison Example 1 using the coating composition for interlayer (1) and the coating composition for interlayer (2) in place of the coating compositions for the interlayers (7), a sample for Example 5 was prepared.

That is, the coating composition for light- and heat-sensitive layer (1) was coated on a polyethylene terephthalate film of a thickness of 100 μm using a coating bar at a dry weight of 8 g/m² and dried for 10 minutes at 30° C. Then, the coating composition for interlayer (1) prepared as described above was coated on the layer at a dry thickness of 5 g/m² and dried. The coating composition for light and heat-sensitive layer (2) was then coated on the layer at a dry weight of 8 g/m² and dried. Then, the coating composition for interlayer (2) prepared as described above was coated on the layer at a dry weight of 5 g/m² and dried. The coating composition for light- and heat-sensitive layer (3) was coated then on the layer at a dry weight of 8 g/m² and dried. Furthermore, the coating composition for protective layer (1) was coated thereon with a coating bar at a dry weight of 5 g/m² and dried for 10 minutes at 30° C. to provide a sample for Example 5.

When the light- and heat-sensitive recording material obtained was exposed and heat-developed in the same manner as in Comparison Example 1, clear full color images were obtained. The cyan, magenta, and yellow densities of the exposed portions were 1.1, 1.2, and 0.9, respectively.

EXAMPLE 6

By following the same procedure as in Example 5 using the same coating composition for interlayer (3) and the coating composition for interlayer (4) each prepared as described above in place of the coating compositions for interlayer (1) and interlayer (2), a sample for Example 6 was prepared.

When the light- and heat-sensitive recording material obtained was exposed and heat-developed in the same manner as in Comparison Example 1, clear full color images were obtained. The cyan, magenta, and yellow densities of the exposed portions were 1.3, 1.3, and 1.1, respectively.

EXAMPLE 7

By following the same procedure as in Example 5 using the coating composition for interlayer (5) and the coating composition for interlayer (6) each prepared as described above in place of the coating compositions for interlayer (1) and interlayer (2), a sample for Example 7 was prepared.

When the light- and heat-sensitive recording material obtained was exposed and heat-developed in the same manner as in Comparison Example 1, clear full color images were obtained. The cyan, magenta, and yellow densities of the exposed portions were 1.6, 1.6, and 1.4, respectively.

As is clear from the results obtained with these examples and comparison examples, in the light- and heat-sensitive recording material of this invention having interlayers containing a ultraviolet absorbent, the sensitive wavelength of each light- and heat-sensitive layer can be sufficiently separated and clear multicolor negative images can be obtained. In particular, when a latex formed by copolymerizing a ultraviolet absorber monomer is used as the ultraviolet absorbent for the interlayers, clear multicolor images having high colored densities can be obtained.

COMPARISON EXAMPLE 3

The coating composition for light- and heat-sensitive layer (9) prepared as described above was coated on a polyethylene terephthalate film of a thickness of 100 μm with a coating bar at a dry weight of 8 g/m² and dried for 10 minutes at 30° C. Then, the coating composition for interlayer (7) prepared as described above was coated on the layer at a dry weight of 5 g/m² and dried. The coating composition for light- and heat-sensitive layer (10) prepared as described above was then coated on the interlayer at a dry weight of 8 g/m² and dried. Then, the coating composition for light- and heat-sensitive layer (7) as described above was coated the layer at a dry weight of 5 g/m² and dried. The coating composition for light- and heat-sensitive layer (11) prepared as described above then was coated on the layer at a dry weight of 8 g/m² and dried. Furthermore, the coating composition for protective layer (1) prepared as described above was coated thereon with a coating bar at a dry weight of 5 g/m² and dried for 10 minutes at 30° C. to provide a sample for Comparison Example 3.

The light- and heat-sensitive recording material thus obtained was first exposed through a lithographic film having developed images for cyan and an optical filter cutting light of wavelengths of 410 nm. and shorter (SC-41 Filter, trade name, made by Fuji Photo Film Co., Ltd.) to ultraviolet light from a 1000 watt high-pressure mercury lamp (Jet Light, made by Oak Co.). Then, the recording material was exposed through a lithographic film having developed images for magenta and an optical filter transmitting light of wavelength of about 360 nm only (BPB-36 Filter, trade name, made by Fuji Photo Film Co., Ltd.) to ultraviolet light from a high-pressure mercury lamp, and further exposed through a lithographic film having developed images for yellow and an optical filter transmitting light of wavelength of about 300 nm only (BPB-30 Filter, trade name, made by Fuji Photo Film Co., Ltd.) to ultraviolet light from a high-pressure mercury lamp to provide latent images. Thereafter, the recording material was heated for 5 seconds at 110° C. but full color images were not obtained and images mainly composed of yellow images were obtained.

COMPARISON EXAMPLE 4

The coating composition for light- and heat-sensitive layer (12) prepared as described above was coated on a polyethylene terephthalate film of a thickness of 100 μm with a coating bar at a dry weight of 8 g/m² and dried for 10 minutes at 30° C. Then, the coating composition for interlayer (7) as described above was coated on the layer at a dry weight of 5 g/m² and dried. The coating composition for light- and heat-sensitive layer (13) was then coated on the layer at a dry weight of 8 g/m² and dried. Then, the coating composition for interlayer (7) described above was coated on the layer at a dry weight of 5 g/m² and dried. The coating composition for light- and heat-sensitive layer (11) prepared as described above was then coated on the layer at a dry weight of 8 g/m² and dried. Furthermore, the coating composition for protective layer (1) as described above was coated thereon with a coating bar at a dry weight of 5 g/m² and dried for 10 minutes at 30° C. to provide a sample for Comparison Example 4.

The light- and heat-sensitive recording material obtained was exposed and heat-developed in the same manner as in Comparison Example 3 and obscure full color images having low colored density were obtained.

EXAMPLE 8

By following the same procedure as in the case of preparing the sample of Comparison Example 3 using the coating composition for interlayer (8) and the coating composition for interlayer (2) in place of the coating compositions for the interlayers (7), a sample for Example 8 was prepared.

That is, the coating composition for light- and heat-sensitive layer (9) was coated on a polyethylene terephthalate film of a thickness of 100 μm with a coating bar at a dry weight of 8 g/m² and dried for 10 minutes at 30° C. Then, the coating composition for interlayer (8) prepared as described above was coated on the layer at a dry thickness of 5 g/m² and dried The coating composition for light- and heat-sensitive layer (10) then was coated on the layer at a dry weight of 8 g/m² and dried. Then, the coating composition for interlayer (2) prepared as described above was coated on the layer at a dry weight of 5 g/m² and dried. The coating composition for light- and heat-sensitive layer (11) was coated then on the layer at a dry weight of 8 g/m² and dried. Furthermore, the coating composition for protective layer (1) was coated thereon with a coating bar at a dry weight of 5 g/m² and dried for 10 minutes at 30° C. to provide the sample for Example 8.

When the light- and heat-sensitive recording material obtained was exposed and heat-developed in the same manner as in Comparison Example 3, clear full color images were obtained. The cyan, magenta, and yellow densities of the non-exposed portions were 1.1, 1.2, and 0.9, respectively.

EXAMPLE 9

By following the same procedure as in Example 8 using the same coating composition for interlayer (10) and the coating composition for interlayer (4) each prepared as described above in place of the coating compositions for interlayer (8) and interlayer (2), a sample for Example 9 was prepared.

When the light- and heat-sensitive recording material obtained was exposed and heat-developed in the same manner as in Comparison Example 3, clear full color images were obtained. The cyan, magenta, and yellow densities of the non-exposed portions were 1.2, 1.2, and 1.0, respectively.

EXAMPLE 10

By following the same procedure as in Example 8 using the same coating composition for interlayer (12) and the coating composition for interlayer (6) each prepared as described above in place of the coating compositions for interlayer (8) and interlayer (2), a sample for Example 10 was prepared.

When the light- and heat-sensitive recording material obtained was exposed and heat-developed in the same manner as in Comparison Example 3, clear full color images were obtained. The cyan, magenta, and yellow densities of the non-exposed portions were 1.4, 1.4, and 1.1, respectively.

As is clear from the results obtained in these Examples 8 to 10 and Comparison Examples 3 and 4, in the light- and heat sensitive recording material of this invention having interlayers containing a ultraviolet absorbent, the sensitive wavelength of each light- and heat-sensitive layer can be sufficiently separated and clear multicolor images can be obtained. In particular, when a latex formed by copolymerizing a ultraviolet absorber monomer is used as the ultraviolet absorbent for the interlayers, clear multicolor images having high colored densities can be obtained.

EXAMPLES 11 TO 14 AND COMPARISON EXAMPLES 5 AND 6

Each of the coating compositions for light- and heat-sensitive layer (14) to (17), (19) and (20) prepared above were coated on a polyethylene terephthalate film of a thickness of 100 μm with a coating bar at a dry weight of 8 g/m² had dried for 10 minutes at 30° C. Then, the coating composition for protective layer (1) prepared above was coated on each layer with a coating bat at a dry weight of 5 g/m² and dried for 10 minutes at 30° C. to provide light- and heat-sensitive recording materials (14) to (17), (19) and (20).

The light- and heat-sensitive material obtained was light-exposed for 500 seconds using a spectrograph (made by Narumi Shookai K.K.) and thereafter heated for 5 seconds by with a hot plate at 110° C. The spectral sensitivity curve obtained is shown in FIGS. 2 to 7.

Also, each of the these light- and heat-sensitive material Nos. (14) to (17) and Nos. (19) and (20) was exposed to light from a 2kW super high-pressure mercury lamp (Jet Printer JP-2000EX, trade name, made by Oak Co.) through (1) a step wedge (density difference 0.15, density step number 1 to 15 steps, Fuji Step Guide P, trade name, made by Fuji Photo Film Co., Ltd.) and an optical filter transmitting light of about 300 nm (BPB-30 Filter, trade name, made by Fiji Photo Film Co., Ltd.) [Evaluation (1)], (2) the above-described step wedge and an optical filter emitting light of about 360 nm only (BPB-36 Filter, trade name, made by Fuji Photo Film Co., Ltd.) [Evaluation (2)], or (3) the above-described step wedge and an optical filter intercepting light having wavelengths of 390 nm and shorter (SC-41 Filter, made by Fuji Photo Film Co., Ltd.) (Evaluation (3)], and thereafter, was heated for 5 seconds using a hot plate at 110° C.

In addition, the exposure time was 300 seconds in Evaluation (1), 60 seconds in Evaluation (2), and 60 seconds in Evaluation (3).

The sensitivity of the light- and heat-sensitive material is shown by the step number of the step wedge corresponding to about 90% of the unexposed portion of the step wedge image formed on the light- and heat-sensitive material by coloring. A larger step number means a higher sensitivity.

The sensitivities in the case of exposure to light having three different wavelengths, respectively, are shown in Table 2 below. In addition, the spectral characteristics of the optical filters used are shown in FIG. 1. Also, the peak absorption wavelengths of the photopolymerization initiators (measured in acetonitrile) are shown in Table 2.

On comparing the examples of photopolymerization initiators for use in this invention with comparison examples (light-sensitive and heat-sensitive sheet No. 14 or 15 with No. 16 or 17 with No. 19), it can be seen that the skirt of the light-sensitive region wavelength can be very sharply cut in the case of using the photopolymerization initiator for use in this invention even through the peak absorption wavelength of the photopolymerization initiator in the former is longer than in the latter.

TABLE 2

| Light- and Heat-Sensitive Recording Material | Photopolymerization Initiator (peak wavelength absorbed) | Optical Sensitivity | Evaluation (1) BPB-30 | (2) BPB-36 | (3) SC-41 |
|---|---|---|---|---|---|
| Light-Sensitive Layer for Short Wave | | | | | |
| No. 14 (The Present Invention) | Photopolymerization Initiator (5) (288 nm) | 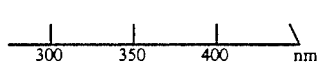 | 10 steps | — | — |
| No. 15 (The Present Invention) | Photopolymerization Initiator (6) (298 nm) | 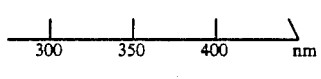 | 11 steps | — | — |
| No. 16 (Comparison Example) | Photopolymerization Initiator (7) (280 nm) | 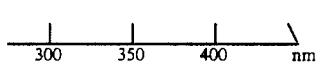 | 8 steps | 6 steps | — |
| Light-Sensitive Layer for Medium Wave | | | | | |
| No. 17 (The Present Invention) | Photopolymerization Initiator (2) (326 nm) | 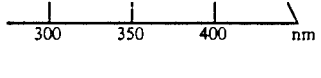 | — | 11 steps | — |
| No. 19 (Comparison Example) | Photopolymerization Initiator (8) (311 nm) | 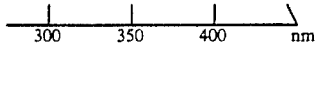 | — | 11 steps | 10 steps |

TABLE 2-continued

| Light- and Heat-Sensitive Recording Material | Photopolymerization Initiator (peak wavelength absorbed) | Optical Sensitivity | Evaluation (1) BPB-30 | (2) BPB-36 | (3) SC-41 |
|---|---|---|---|---|---|
| Light-Sensitive Layer for Long Wave No. 20 | Photopolymerization Initiator (1) + Optical Sensitizer (1) | 300  350  400  nm | — | — | 13 steps |

These light- and heat-sensitive materials usually have a gradation with a width of from about 5 to 6 steps (the difference between the small ester step number showing the maximum density and the largest step number showing the minimum density is shown as the width of gradation). Accordingly, when these light- and heat-sensitive layers are superposed in a multilayer state and each layer is separately exposed to light having a different wavelength, for obtaining completely separate images, a sensitivity difference of at least 7 steps is necessary between the layer sensitive to light of each wavelength and the layer being not sensitive to light.

With this invention, completely separate images by at each sensitive wavelength was first attained.

EXAMPLE 15 AND COMPARISON EXAMPLE 7

The coating composition for light- and heat-sensitive layer (20) prepared as described above was coated on a polyethylene terephthalate film of a thickness of 100 μm with a coating bar at a dry weight of 8 g/m² and dried for 10 minutes at 30° C. Then, the coating composition for interlayer (7) prepared as described above was coated on the layer at a dry weight of 5 g/m² and dried. The coating composition for light- and heat-sensitive layer (17) prepared as described above was then coated on the interlayer at a dry weight of 8 g/m² and dried. Then, the coating composition for light- and heat-sensitive layer (7) as described above was coated on the layer at a dry weight of 5 g/m² and dried. The coating composition for light- and heat-sensitive layer (15) prepared as described above then was coated on the layer at a dry weight of 8 g/m² and dried. Furthermore, the coating composition for protective layer (1) prepared as described above was coated thereon with a coating bar at a dry weight of 5 g/m² and dried for 10 minutes at 30° C. to provide a light- and heat-sensitive recording material for Example 15.

By following the same procedure of Example 15 except that the coating compositions for light- and heat-sensitive layer (19) and (16) were used in place of the coating compositions for light- and heat-sensitive layer (17) and (14), respectively, a light- and heat-sensitive recording material for Comparison Example 7 was produced.

The light- and heat-sensitive recording materials thus obtained were first exposed through a lithographic film having developed images for cyan and an optical filter transmitting light of wavelengths of about 300 nm. only (BPB-30 Filter) to light from a 2000 watt ultrahigh-pressure mercury lamp (Jet Printer JP 2000 EX, made by Oak Co.). Then, the recording materials were exposed through a lithographic film having developed images for magenta and an optical filter transmitting light of wavelength of about 360 nm only (BPB-36 Filter, trade name, made by Fuji Photo Film Co., Ltd.) to light from an ultrahigh-pressure mercury lamp, and further exposed through a lithographic film having developed images for yellow and an optical filter cutting light of wavelengths of 390 nm and shorter (SC-41 Filter, trade name, made by Fuji Photo Film Co., Ltd.) to light from an ultrahigh-pressure mercury lamp to provide latent images. Thereafter, the recording materials were heated for 5 seconds at 110° C.

The light- and heat-sensitive recording material for Comparison Example 7 produced an unclear full color image with low coloring density. The cyan, magenta, and yellow densities were 0.5, 0.2, and 0.9, respectively.

On the other hand, the light- and heat-sensitive recording material for Example 15 resulted in a clear full color image. The cyan, magenta, and yellow densities were 1.4, 1.2, and 0.9, respectively.

EXAMPLE 16

The coating composition for light- and heat-sensitive layer (21) prepared as described above was coated on a polyethylene terephthalate film of a thickness of 100 μm with a coating bar at a dry weight of 8 g/m² and dried for 10 minutes at 30° C. Then, the coating composition for interlayer (10) as described above was coated on the layer at a dry weight of 5 g/m² and dried. The coating composition for light- and heat-sensitive layer (18) was then coated on the layer at a dry weight of 8 g/m² and dried. Then, the coating composition for interlayer (2) described above was coated on the layer at a dry weight of 5 g/m² and dried. The coating composition for light- and heat-sensitive layer (15) prepared as described above then was coated on the layer at a dry weight of 8 g/m² and dried. Furthermore, the coating composition for protective layer (1) as described above was coated thereon with a coating bar at a dry weight of 5 g/m² and dried for 10 minutes at 30° C. to provide a light- and heat-sensitive recording material for Example 16.

The light- and heat-sensitive material obtained was exposed and heated as in Example 15 and a clear full color image was obtained. The maximum cyan, magenta, and yellow coloring densities were 1.4, 1.4, and 1.1, respectively.

As is clear from the results of Examples 15 and 16 and Comparison Examples 5 to 7, when the trihalomethyltriazine compound shown by formula (I) or the azinium salt compound shown by formula (II) are used as the photopolymerization initiator, the skirt at the long wavelength side of the light-sensitive region is sharply cut to sufficiently separate the light-sensitive wavelengths sensitive to each light- and heat-sensitive layer, whereby a clear multicolor image can be obtained.

COMPARISON EXAMPLE 8

The coating composition for light- and heat-sensitive layer (9) prepared as described above was coated on a polyethylene terephthalate film of a thickness of 100 μm with a coating bar at a dry weight 1 of 8 g/m² and dried for 10 minutes at 30° C. Then, the coating composition for interlayer (11) prepared as described above was coated on the layer at a dry weight of 5 g/m² and dried. The coating composition for light- and heat-sensitive layer (10) prepared as described above was then coated on the interlayer at a dry weight of 8 g/m² and dried. Then, the coating composition for interlayer (12) as described above was coated on the layer at a dry weight of 5 g/m² and dried. The coating composition for light- and heat-sensitive layer (11) prepared as described above then was coated on the layer at a dry weight of 8 g/m² and dried, to provide a sample for Comparison Example 8.

The light- and heat-sensitive recording material thus obtained was first exposed through a lithographic film having developed images for cyan and an optical filter cutting light of wavelengths of 410 nm and shorter (SC-41 Filter, trade name, made by Fuji Photo Film Co., Ltd.) to ultraviolet light from a 1000 watt high-pressure mercury lamp (Jet Light, made by Oak Co.). At this point, stain on a lithographic film by the light- and heat-sensitive recording material was observed. Then, the recording materials were exposed through a lithographic film having developed images for magenta and an optical filter transmitting light of wavelength of about 360 nm only (BPB-36 Filter, trade name, made by Fuji Photo Film Co., Ltd.) to light from a high-pressure mercury lamp, and further exposed through a lithographic film having developed images for yellow and an optical filter transmitting light of wavelength of about 300 nm only (BPB-30 Filter, trade name, made by Fuji Photo Film Co., Ltd.) to light from a high-pressure mercury lamp to provide latent images. Thereafter, the recording material was heated for 5 seconds at 110° C. but an image was not obtained because of adhesion of the light- and heat-sensitive recording material to the heating means.

EXAMPLE 17

The coating composition for protective layer (6) was coated on the sample of Comparison Example 8 with a coating bar at a dry weight of 5 g/m² and dried for 10 minutes at 30° C. to provide a sample for Example 17.

The light- and heat-sensitive recording material thus obtained were first exposed through a lithographic film having developed images for cyan and an optical filter cutting light of wavelengths of 410 nm and shorter (SC-41 Filter, trade name, made by Fuji Photo Film Co., Ltd.) to ultraviolet light from a 1000 watt high-pressure mercury lamp (Jet Light, made by Oak Co.). At this point, the light- and heat-sensitive recording material and the lithographic film having developed images for cyan were easily separated from each other without stain on the lithographic film by the recording material. Then, the recording material was exposed through a lithographic film having developed images for magenta and an optical filter transmitting light of wavelength of about 360 nm only (BPB-36 Filter, trade name, made by Fuji Photo Film Co., Ltd.) to light from a high-pressure mercury lamp, and further exposed through a lithographic film having developed images for yellow and an optical filter transmitting light of wavelength of about 300 nm only (BPB-30 Filter, trade name, made by Fuji Photo Film Co., Ltd.) to light from a high-pressure mercury lamp to provide latent images. Thereafter, the recording material was heated for 5 seconds at 110° C. to obtain a clear full color image with color development only on the non-exposed portion.

EXAMPLE 18

The coating composition for protective layer (2) was coated on the sample of Comparison Example 8 with a coating bar at a dry weight of 5 g/m² and dried for 10 minutes at 30° C. to provide a sample for Example 18.

The light- and heat-sensitive recording material thus obtained was exposed in the same manner as in Example 17. Also, in this case, at this point the light- and heat-sensitive recording material and the lithographic film having developed images for cyan were easily separated from each other without stain on the lithographic film by the recording material. Thereafter, the recording material was heated for 5 seconds at 110° C. to obtain a clear full color image with color development only on the non-exposed portion.

EXAMPLE 19

The coating composition for protective layer (3) was coated on the sample of Comparison Example 8 with a coating bar at a dry weight of 5 g/m² and dried for 10 minutes at 30° C. to provide a sample for Example 19.

The light- and heat-sensitive recording material thus obtained was exposed in the same manner as in Example 17. Also, in this case, at this point the light- and heat-sensitive recording material and the lithographic film having developed images for cyan were easily separated from each other without stain on the lithographic film by the recording material under high humidity. Thereafter, the recording material was heated for 5 seconds at 110° C. to obtain a clear full color image with color development only on the non-exposed portion.

EXAMPLE 20

The coating composition for protective layer (4) was coated on the sample of Comparison Example 8 with a coating bar at a dry weight of 5 g/m² and dried for 10 minutes at 30° C. to provide a sample for Example 20.

The light- and heat-sensitive recording material thus obtained was exposed in the same manner as in Example 17. Also, in this case, the light- and heat-sensitive recording material and the lithographic film having developed images for cyan were easily separated from each other without stain on the lithographic film by the recording material even under high humidity. Thereafter, the recording material was heated for 5 seconds at 110° C. to obtain a clear full color image with color development only on the non-exposed portion.

EXAMPLE 21

The coating composition for protective layer (5) was coated on the sample of Comparison Example 8 with a coating bar at a dry weight of 5 g/m² and dried for 10 minutes at 30° C. to provide a sample for Example 21.

The light- and heat-sensitive recording material thus obtained was exposed in the same manner as in Example 17. Also, in this case, the light- and heat-sensitive recording material and the lithographic film having developed images for cyan were easily separated from each other without stain on the lithographic film by the recording material even under high humidity. Thereafter, the recording material was heated for 5 seconds at

What is claimed is:

1. A light- and heat-sensitive recording material comprising a support having thereon at least one light- and heat-sensitive layer comprising,
   (1) microcapsules comprising a wall and a core containing an electron donative colorless dye, and
   (2) a light-hardenable composition arranged outside of said microcapsules containing (a) a polymerizable compound having at least one atom with an unpaired electron and at least one ethylenically unsaturated bond in the molecule, (b) a photopolymerization initiator, and (c) an electron acceptive developer, the wall of said microcapsules having increased permeability to the electron acceptive developer and polymerizable compound upon heating,
   wherein said light-hardenable composition is imagewise hardened by imagewise exposure of the recording material to light to form a hardened latent image, and subsequently under heating, the electron acceptive developer diffuses into the microcapsules in both the exposed portions and the unexposed portions whereas the polymerizable compound diffuses into the microcapsules in the unexposed portions only, to thereby obtain a color image in the exposed portions.

2. The light- and heat-sensitive recording material as in claim 1, wherein said atom is present in a bonding selected from the group of ester bond, amide bond, amine bond, carbonyl bond and ether bond in the molecule.

3. The light- and heat-sensitive recording material as in claim 1, wherein said polymerizable vinyl monomer has a molecular weight of from 200 to 1,000 and has a plurality of ethylenical double bonds.

4. The light- and heat-sensitive recording material as in claim 1, wherein said recording material has at least two light- and heat-sensitive layers and an interlayer containing an ultraviolet absorbent is present between said light- and heat-sensitive layers.

5. The light- and heat-sensitive recording material as in claim 4, wherein said ultraviolet absorbent is dispersed as fine particles thereof.

6. The light- and heat-sensitive recording material as in claim 4, wherein said ultraviolet absorbent is latex-dispersed.

7. The light- and heat-sensitive recording material as in claim 4, wherein said ultraviolet absorbent is a latex formed by copolymerizing a ultraviolet absorbent monomer.

8. The light- and heat-sensitive recording material as in claim 1, wherein said recording material has at least two light- and heat-sensitive layers and said photopolymerization initiator present in at least one of the light- and heat-sensitive layers is a compound represented by formula (I) or (II);

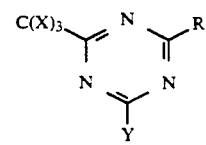

wherein X represents a halogen atom; Y represents $-C(X)_3$, $-NH_2$, $-NHR'$, $-N(R')_2$, or $-OR'$, wherein R' represents an alkyl group, a substituted alkyl group, an aryl group or a substituted aryl group; and R represents $-C(X)_3$, an alkyl group, a substituted alkyl group an aryl group, a substituted aryl group, or a substituted alkenyl group;

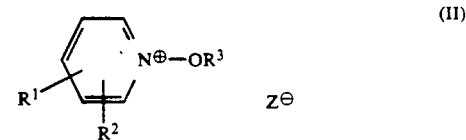

wherein $R^1$ represents an alkyl group, a substituted alkyl group, an aryl group, a substituted aryl group, a substituted alkenyl group, $R^4CO-$ or $R^4OCO-$, wherein $R^4$ represents an alkyl group, a substituted alkyl group, an aryl group, or a substituted aryl group; $R^2$ represents a hydrogen atom, an alkyl group, a substituted alkyl group, an aryl group, or a substituted aryl group; and $R^1$ and $R^2$ may form together an aromatic ring; $R^3$ represents an alkyl group or a substituted alkyl group; and Z represents a counter anion.

9. The light- and heat-sensitive recording material as in claim 7, wherein each of said light- and heat-sensitive layers other than the uppermost layer contains an ultraviolet absorbent and the photo-polymerization initiator present in each layer other than the lowermost layer is a compound represented by formula (I) or (II).

10. The light- and heat-sensitive recording material as in claim 7, wherein interlayer(s) containing an ultraviolet absorbent is present between the light- and heat-sensitive layers and the photopolymerization initiator present in each layer other than the lowermost layer is a compound represented by formula (I) or (II).

11. The light- and heat-sensitive recording material as in claim 1, wherein a protective layer comprising an organic polymer is present on the uppermost light- and heat-sensitive layer.

12. The light- and heat-sensitive recording material as in claim 10, wherein said protective layer contains matting agent particles.

13. The light- and heat-sensitive recording material as in claim 10, wherein said protective layer contains a hardening agent for the organic polymer.

14. The light- and heat-sensitive recording material as in claim 11, wherein said protective layer contains a hardening agent for the organic polymer.

15. A light- and heat-sensitive recording material comprising a support having thereon at least one light- and heat-sensitive layer comprising,
   (1) microcapsules comprising a wall and a core containing an electron donative colorless dye, and
   (2) a light-hardenable composition arranged outside of said microcapsules containing (d) an electron acceptive polymerizable vinyl monomer and (b) a photopolymerization initiator, the wall of said microcapsules having increased permeability to the polymerizable vinyl monomer upon heating, wherein said light-hardenable composition is imagewise hardened by imagewise exposure of the recording material to light to form a hardened latent image, and subsequently under heating, the polymerizable vinyl monomer diffuses into the microcapsules in the unexposed portions only, to thereby obtain a color image in the unexposed portions.

16. The light- and heat-sensitive recording material as in claim 15, wherein said recording material has at least two light- and heat-sensitive layers and an interlayer containing an ultraviolet absorbent is present between said light- and heat-sensitive layers.

17. The light- and heat-sensitive recording material as in claim 15, wherein said ultraviolet absorbent is dispersed as fine particles thereof.

18. The light- and heat-sensitive recording material as in claim 15, wherein said ultraviolet absorbent is latex-dispersed.

19. The light- and heat-sensitive recording material as in claim 15, wherein said ultraviolet absorbent is a latex formed by copolymerizing a ultraviolet absorbent monomer.

20. The light- and heat-sensitive recording material as in claim 15, wherein said recording material has at least two light- and heat-sensitive layers and said photopolymerization initiator present in at least one of the light- and heat-sensitive layers is a compound represented by formula (I) or (II);

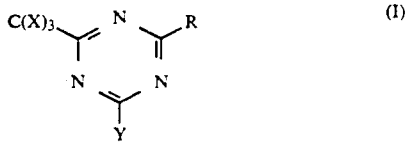

wherein X represents a halogen atom; Y represents —C(X)$_3$, —NH$_2$, —NHR', —N(R')$_2$, or —OR', wherein R' represents an alkyl group, substituted alkyl group, an aryl group, or a substituted aryl group; and R represents —C(X)$_3$, an alkyl group, a substituted alkyl group, an aryl group, a substituted aryl group, or a substituted alkenyl group;

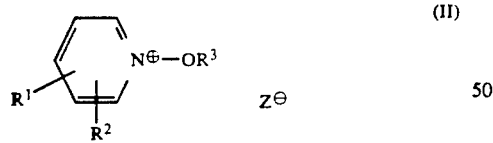

wherein R$^1$ represents an alkyl group, a substituted alkyl group, an aryl group, a substituted aryl group, a substituted alkenyl group, R$^4$CO— or R$^4$OCO—, wherein R$^4$ represents an alkyl group, a substituted alkyl group, an aryl group, or a substituted aryl group; R$^2$ represents a hydrogen atom, an alkyl group, a substituted alkyl group, an aryl group, or a substituted aryl group; and R$^1$ and R$^2$ may form together an aromatic ring; R$^3$ represents an alkyl group or a substituted alkyl group; and Z represents a counter anion.

21. The light- and heat-sensitive recording material as in claim 19, wherein each of said light- and heat-sensitive layers other than the uppermost layer contains an ultraviolet absorbent and the photopolymerization initiator present in each layer other than the lowermost layer is a compound represented by formula (I) or (II).

22. The light- and heat-sensitive recording material as in claim 19, wherein interlayer(s) containing an ultraviolet absorbent is present between the light- and heat-sensitive layers and the photopolymerization initiator present in each layer other than the lowermost layer is a compound represented by formula (I) or (II).

23. The light- and heat-sensitive recording material as in claim 15, wherein a protective layer comprising an organic polymer is present on the uppermost light- and heat-sensitive layer.

24. The light- and heat-sensitive recording material as in claim 22, wherein said protective layer contains matting agent particles.

25. The light- and heat-sensitive recording material as in claim 22, wherein said protective layer contains a hardening agent for the organic polymer.

26. The light- and heat-sensitive recording material as in claim 23, wherein said protective layer contains a hardening agent for the organic polymer.

27. A method for forming an image comprising:
(A) imagewise exposing to light a light- and heat-sensitive recording material comprising a support having thereon at least one light- and heat-sensitive layer comprising, (1) microcapsules comprising a wall and a core containing an electron donative colorless dye, and (2) a light-hardenable composition arranged outside of said microcapsules containing (a) a polymerizable compound having at least one atom with an unpaired electron and at least one ethylenically unsaturated bond in the molecule, (b) a photopolymerization initiator, and (c) an electron acceptive developer, the wall of said microcapsules having increased permeability to the electron acceptive developer and polymerizable compound upon heating, to thereby harden the light-hardenable composition in the exposed portions of the recording material; and
(B) heating the recording material under the condition where the microcapsules are not ruptured to form color in the hardened portions of the recording material.

28. A method for forming an image comprising:
(A) imagewise exposing to light a light- and heat-sensitive recording material comprising a support having thereon at least one light- and heat-sensitive layer comprising, (1) microcapsules comprising a wall and a core containing an electron donative colorless dye, and (2) a light-hardenable composition arranged outside of said microcapsules containing (d) an electron acceptive polymerizable vinyl monomer and (b) a photopolymerization initiator, the wall of said microcapsules having increased permeability to the polymerizable vinyl monomer upon heating, to thereby harden the light-hardenable composition in the exposed portions of the recording material; and
(B) heating the recording material under the condition where the microcapsules are not ruptured to form color in the unhardened portions of the recording material.

* * * * *